US011018150B2

(12) United States Patent
Fujii et al.

(10) Patent No.: US 11,018,150 B2
(45) Date of Patent: May 25, 2021

(54) SEMICONDUCTOR MEMORY DEVICE INCLUDING ARTIFICIAL DRAIN SELECT GATE AND METHOD FOR DRIVING SAME

(71) Applicant: TOSHIBA MEMORY CORPORATION, Minato-ku (JP)

(72) Inventors: Kotaro Fujii, Yokkaichi (JP); Yasuhiro Uchiyama, Yokkaichi (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 142 days.

(21) Appl. No.: 16/128,103

(22) Filed: Sep. 11, 2018

(65) Prior Publication Data

US 2019/0221576 A1 Jul. 18, 2019

(30) Foreign Application Priority Data

Jan. 16, 2018 (JP) .............................. JP2018-004761

(51) Int. Cl.
*H01L 27/1157* (2017.01)
*H01L 27/11582* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ......... H01L 27/11582; H01L 27/11565; H01L 27/1157; H01L 27/11578
See application file for complete search history.

(56) References Cited

U.S. PATENT DOCUMENTS

| 7,539,056 | B2 | 5/2009 | Katsumata et al. |
| 8,295,091 | B2 | 10/2012 | Itagaki et al. |
| 9,111,620 | B2 | 8/2015 | Tanzawa |
| 9,391,086 | B1 | 7/2016 | Soda et al. |
| 9,406,693 | B1* | 8/2016 | Pang ................. H01L 27/11582 |
| 10,249,641 | B2* | 4/2019 | Hirotani .................. H01L 28/00 |
| 2007/0258276 | A1* | 11/2007 | Higashitani ........ G11C 16/0483 365/10 |

(Continued)

FOREIGN PATENT DOCUMENTS

JP 2011-96341 A 5/2011

*Primary Examiner* — Allen L Parker
*Assistant Examiner* — Gustavo G Ramallo
(74) *Attorney, Agent, or Firm* — Oblon, McClelland, Maier & Neustadt, L.L.P.

(57) ABSTRACT

A semiconductor memory device includes a first electrode film, a second electrode film separated from the first electrode film in a first direction, a third electrode film separated from the second electrode film in the first direction, a fourth electrode film separated from the third electrode film in the first direction, and a first and a second semiconductor members extending in the first direction. The second electrode film includes a first conductive portion, an insulating portion, and a second conductive portion arranged along a second direction. The first semiconductor member pierces the first, third and fourth electrode films and the insulating portion of the second electrode film. The second semiconductor member pierces the first, third and fourth electrode films, and the first conductive portion or the second conductive portion of the second electrode film.

19 Claims, 17 Drawing Sheets

(56) References Cited

U.S. PATENT DOCUMENTS

| | | | |
|---|---|---|---|
| 2008/0242034 A1* | 10/2008 | Mokhlesi | H01L 27/115 438/287 |
| 2009/0283819 A1* | 11/2009 | Ishikawa | H01L 27/11578 257/324 |
| 2010/0200906 A1* | 8/2010 | Kidoh | H01L 27/11578 257/324 |
| 2011/0103149 A1 | 5/2011 | Katsumata et al. | |
| 2011/0260237 A1* | 10/2011 | Lee | B82Y 10/00 257/325 |
| 2014/0087534 A1* | 3/2014 | Choe | G11C 16/0483 438/270 |
| 2015/0048436 A1 | 2/2015 | Tanaka | |
| 2015/0060971 A1 | 3/2015 | Fujii | |
| 2015/0372000 A1* | 12/2015 | Jee | H01L 27/11573 257/314 |
| 2016/0071593 A1* | 3/2016 | Hashimoto | G11C 16/16 365/185.33 |
| 2016/0155750 A1 | 6/2016 | Yasuda | |
| 2016/0343730 A1* | 11/2016 | Son | H01L 23/528 |
| 2018/0083022 A1* | 3/2018 | Kato | H01L 27/11519 |
| 2020/0091172 A1* | 3/2020 | Mori | H01L 29/40117 |

* cited by examiner

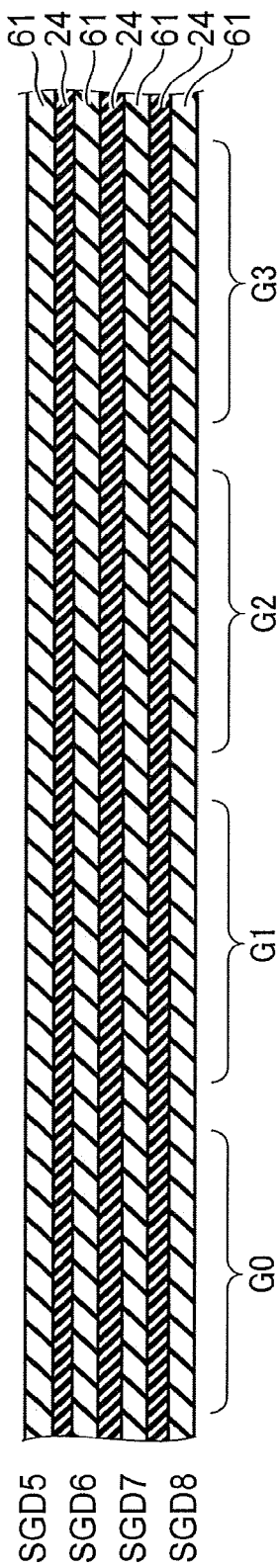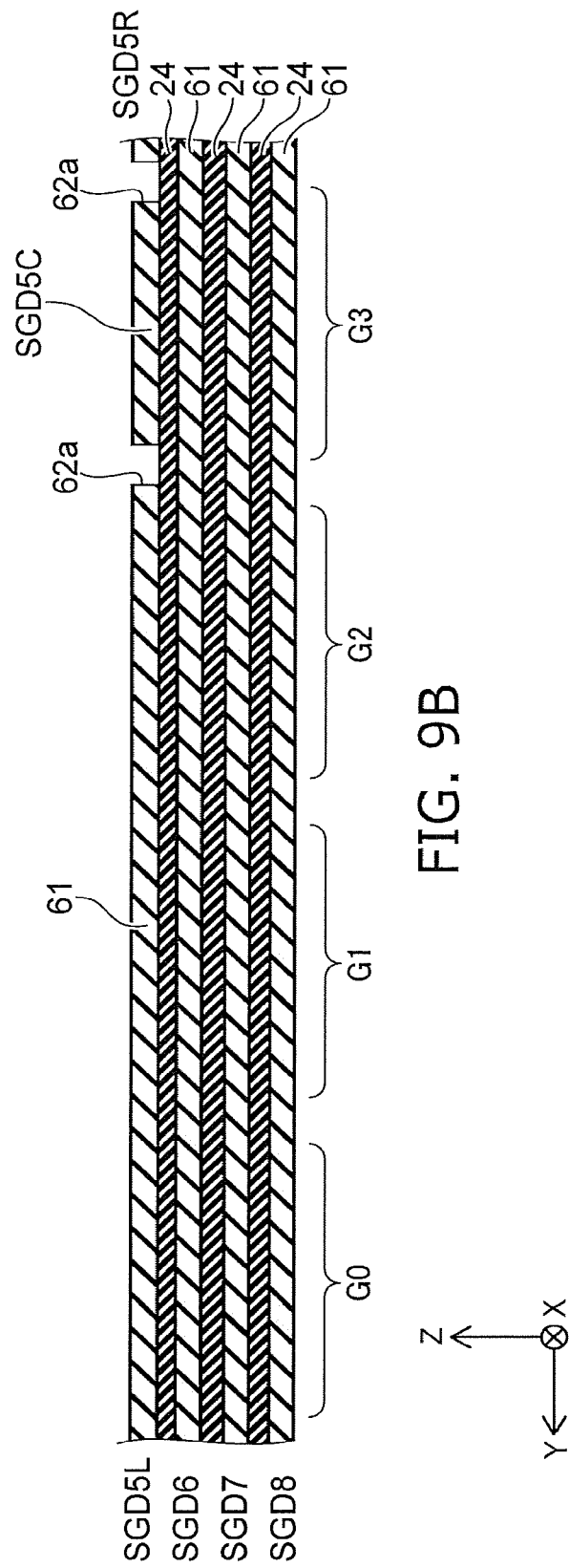

SEMICONDUCTOR MEMORY DEVICE INCLUDING ARTIFICIAL DRAIN SELECT GATE AND METHOD FOR DRIVING SAME

CROSS-REFERENCE TO RELATED APPLICATION

This application is based upon and claims the benefit of priority from Japanese Patent Application NO. 2018-004761, filed on Jan. 16, 2018; the entire contents of which are incorporated herein by reference.

FIELD

Embodiments described herein relate generally to a semiconductor memory device and a method for driving same.

BACKGROUND

In recent years, a stacked semiconductor memory device has been proposed in which memory cells are integrated three-dimensionally. In such a stacked semiconductor memory device, a stacked body in which electrode films and insulating films are stacked alternately is provided on a semiconductor substrate; and semiconductor members that pierce the stacked body are provided. Memory cell transistors are formed at each crossing portion between the electrode films and the semiconductor members. Even higher integration is necessary for such a stacked semiconductor memory device as well.

BRIEF DESCRIPTION OF THE DRAWINGS

FIGS. 9A and 9B are cross-sectional views showing a method for manufacturing the semiconductor memory device according to the embodiment;

DETAILED DESCRIPTION

According to one embodiment, a semiconductor memory device includes a first electrode film, a second electrode film separated from the first electrode film in a first direction, a third electrode film separated from the second electrode film in the first direction, a fourth electrode film separated from the third electrode film in the first direction, a first semiconductor member extending in the first direction, a second semiconductor member extending in the first direction, a first charge storage member provided between the fourth electrode film and the first semiconductor member, and a second charge storage member provided between the fourth electrode film and the second semiconductor member. The second electrode film includes a first conductive portion, an insulating portion, and a second conductive portion arranged along a second direction, the second direction crossing the first direction. The first semiconductor member pierces the first electrode film, the insulating portion of the second electrode film, the third electrode film, and the fourth electrode film. The second semiconductor member pierces the first electrode film, the first conductive portion or the second conductive portion of the second electrode film, the third electrode film, and the fourth electrode film.

Embodiments will now be described.

Figure 1:
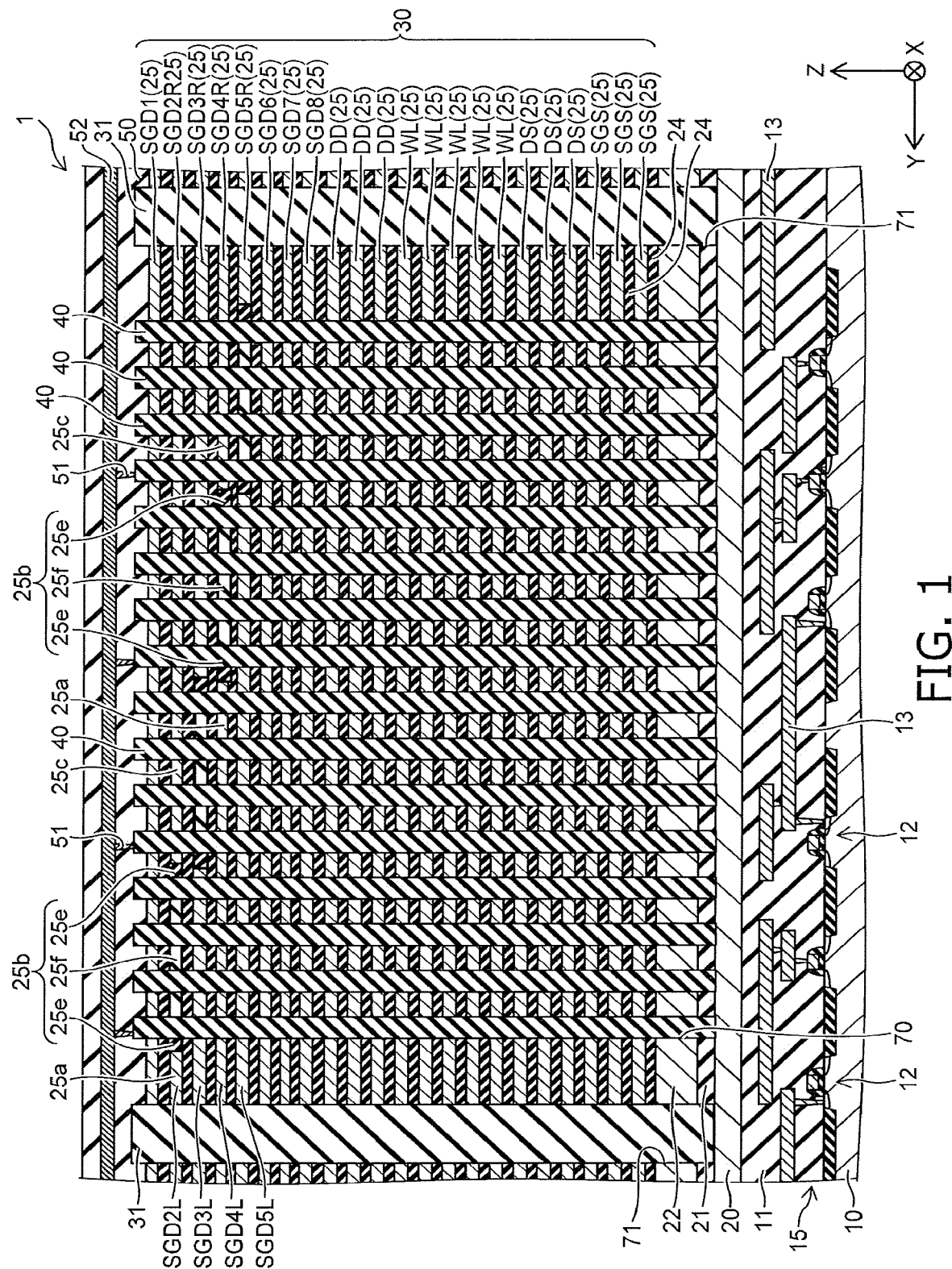
FIG. 1 is a cross-sectional view showing a semiconductor memory device according to an embodiment.
Figure 2:
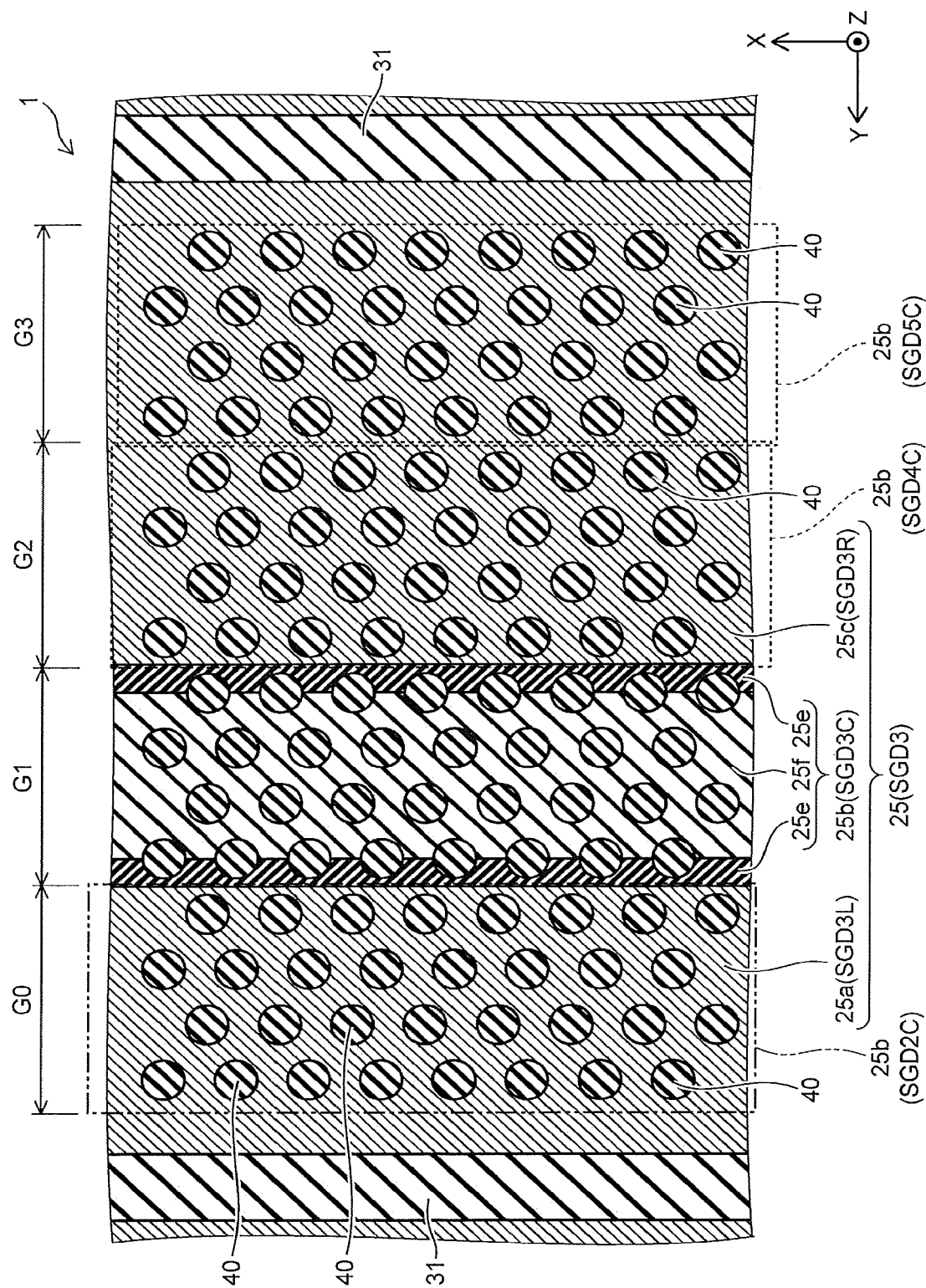
FIG. 2 is a cross-sectional view showing a semiconductor memory device according to the embodiment.

FIG. 1 and FIG. 2 are cross-sectional views showing a semiconductor memory device according to the embodiment.

The semiconductor memory device according to the embodiment is, for example, stacked NAND flash memory.

As shown in FIG. 1, a silicon substrate 10 is provided in the semiconductor memory device 1 according to the embodiment. For example, an inter-layer insulating film 11 that is made of silicon oxide (SiO) is provided on the silicon substrate 10.

In the specification hereinbelow, an XYZ orthogonal coordinate system is employed for convenience of description. The arrangement direction of the silicon substrate 10 and the inter-layer insulating film 11 is taken as a "Z-direction;" and two mutually-orthogonal directions orthogonal to the Z-direction are taken as an "X-direction" and a "Y-direction." Although a direction that is in the Z-direction from the silicon substrate 10 toward the inter-layer insulating film 11 also is called "up" and the reverse direction also is called "down," these expressions are for convenience and are independent of the direction of gravity.

In the specification, a "silicon substrate" is a substrate including silicon (Si) as a major component. This is similar for the other constituents as well; and in the case where the material name is included in the name of the constituent, the material is a major component of the constituent.

A drive circuit 15 that includes a MOSFET (Metal-Oxide-Semiconductor Field-Effect Transistor) 12, an interconnect 13, and the like is formed inside the inter-layer insulating film 11 and the upper layer portion of the silicon substrate 10.

A source electrode film 20 is provided on the inter-layer insulating film 11. The source electrode film 20 spreads along the XY plane. The source electrode film 20 is, for example, a stacked film made of a metal film and a polysilicon film.

An insulating film 21 that is made of, for example, silicon oxide is provided on the source electrode film 20; and an electrode film 22 that is made of, for example, polysilicon is provided on the insulating film 21. A stacked body 30 in which multiple insulating films 24 and multiple electrode films 25 are stacked alternately one layer at a time is provided on the electrode film 22. The stacking direction of the insulating films 24 and the electrode films 25 is the Z-direction. For example, the insulating films 24 are formed of silicon oxide. At least a portion of the electrode films 25 is formed of a metal material, e.g., tungsten (W). The detailed configurations of the electrode films 25 are described below.

As shown in FIG. 1 and FIG. 2, multiple insulating plates 31 are arranged along the Y-direction on the source electrode film 20. The insulating plates 31 each are made of, for example, silicon oxide and spread along the XZ plane. The insulating plates 31 divide the insulating film 21, the electrode film 22, and the stacked body 30 in the Y-direction; and the lower ends of the insulating plates 31 contact the source electrode film 20. In the semiconductor memory device 1, for example, the portion of the stacked body 30 subdivided by the insulating plates 31 functions as a block included in the minimum unit of the data erase.

Columnar members 40 that extend in the Z-direction are provided inside the insulating film 21, the electrode film 22, and the stacked body 30. The configurations of the columnar members 40 are columnar configurations, e.g., substantially circular columnar configurations having the axis directions in the Z-direction. When viewed from the Z-direction, for example, the columnar members 40 are arranged in a staggered configuration. The detailed configurations of the columnar members 40 are described below.

The configurations of the electrode films 25 will now be described in detail.

Figure 3:
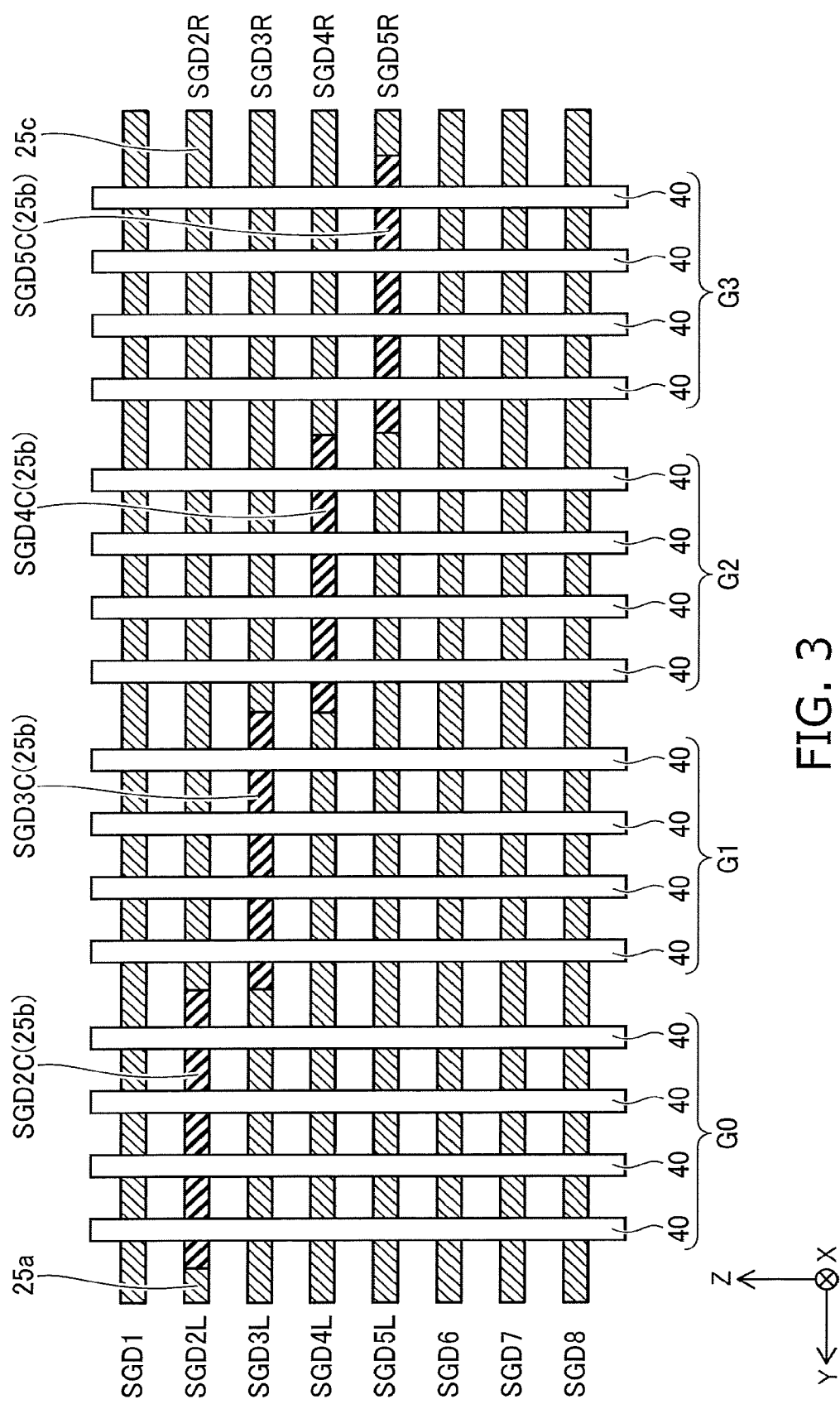
FIG. 3 is a schematic cross-sectional view showing a positional relationship between columnar members and drain-side select gates of the embodiment.

FIG. 3 is a schematic cross-sectional view showing the positional relationship between the columnar members and the drain-side select gates of the embodiment.

As shown in FIG. 1 and FIG. 3, the function of each of the electrode films 25 is set according to the position in the Z-direction. In the example shown in the embodiment, the three electrode films 25 of the first to third levels from the bottom function as source-side select gates (SGS). The three electrode films 25 of the fourth to sixth levels from the bottom function as dummy electrode films DS for relaxing the electric field.

On the other hand, the eight electrode films 25 of the first to eighth levels from the top function as drain-side select gates (SGD). The three electrode films 25 of the ninth to eleventh levels from the top function as dummy electrode films DD for relaxing the electric field. Otherwise, the electrode films 25, i.e., the electrode films 25 of the levels from the seventh level from the bottom to the twelfth level from the top function as word lines (WL). In FIG. 1, the number of word lines drawn is lower than the actual number.

Among the electrode films 25 functioning as the drain-side select gates (SGD), i.e., the electrode films 25 of the first to eighth levels from the top, a conductive portion 25a, an insulating portion 25b, and a conductive portion 25c are provided in this order along the Y-direction in each of the four electrode films 25 of the second to fifth levels from the top. The configurations of the conductive portion 25a, the insulating portion 25b, and the conductive portion 25c each are band configurations extending in the X-direction. The conductive portion 25a and the conductive portion 25c are insulated from each other by the insulating portion 25b. The conductive portion 25a of the electrode film 25 of the second level from the top and the conductive portion 25c of the electrode film 25 of the fifth level from the top may not be provided. In such a case, the insulating portions 25b of the electrode films 25 of the second level and the fifth level from the top contact the insulating plate 31.

The positions in the Y-direction of the insulating portions 25b are shifted from each other between the electrode films 25. However, when viewed from the Z-direction, the Y-direction end portion of the insulating portion 25b of one electrode film 25 may overlap the Y-direction end portion of the insulating portion 25b of an adjacent electrode film 25. FIG. 2 shows the electrode film 25 of the third level from the top.

The conductive portions 25a and 25c are formed of a metal material, e.g., tungsten. Two end portions 25e and one central portion 25f are provided in the insulating portion 25b. The end portions 25e are disposed at the two Y-direction end portions of the insulating portion 25b, extend in the X-direction, and are made of, for example, silicon oxide (SiO). The central portion 25f is disposed between the two end portions 25e, extends in the X-direction, and is made of, for example, silicon nitride (SiN). The relative dielectric constant of the central portion 25f is higher than the relative dielectric constants of the end portions 25e.

Among the electrode films 25 included in the stacked body 30, the electrode films 25 other than the four electrode films 25 of the second to fifth levels from the top do not include the insulating portion and are entirely formed of a metal material, e.g., tungsten.

For convenience of description in the specification, the eight electrode films 25 that function as the drain-side select gates (SGD) are marked with the reference numerals of the "electrode film SGD1" to the "electrode film SGD8" in order from the top. Also, the electrode films 25 (the electrode films SGD2 to SGD5) in which the insulating portion 25b is formed are differentiated by marking the end part of the reference numeral with "L," "C," and "R" for the conductive portion 25a, the insulating portion 25b, and the conductive portion 25c. Although the insulating portion 25b is insulative, the insulating portion 25b is called an "electrode film" for convenience of description because the insulating portion 25b functions artificially as gates of drain-side select transistors as described below.

In other words, for the electrode film 25 of the second level from the top, the conductive portion 25a is taken as the "electrode film SGD2L;" the insulating portion 25b is taken as the "electrode film SGD2C;" and the conductive portion 25c is taken as the "electrode film SGD2R." For the electrode film 25 of the third level from the top, the conductive portion 25a is taken as the "electrode film SGD3L;" the insulating portion 25b is taken as the "electrode film SGD3C;" and the conductive portion 25c is taken as the "electrode film SGD3R." For the electrode film 25 of the fourth level from the top, the conductive portion 25a is taken as the "electrode film SGD4L;" the insulating portion 25b is taken as the "electrode film SGD4C;" and the conductive portion 25c is taken as the "electrode film SGD4R." For the electrode film 25 of the fifth level from the top, the conductive portion 25a is taken as the "electrode film SGD5L;" the insulating portion 25b is taken as the "electrode film SGD5C;" and the conductive portion 25c is taken as the "electrode film SGD5R."

The electrode films 25 each are connected to the drive circuit 15. Also, for the electrode films 25 in which the conductive portions 25a and 25c are provided, the conductive portion 25a and the conductive portion 25c each are connected to the drive circuit 15.

Each of the columnar members 40 pierces the insulating portion 25b of one electrode film 25 of the electrode films SGD2 to SGD5 and pierces the conductive portion 25a or 25c of the remaining electrode films 25 of the electrode films SGD2 to SGD5. There is a constant relationship between the position in the Y-direction of one columnar member 40 and the position in the Z-direction of the insulating portion 25b pierced by the one columnar member 40.

As shown in FIG. 3, the multiple columnar members 40 that are disposed between two mutually-adjacent insulating plates 31, i.e., the multiple columnar members 40 that are disposed inside the stacked body 30 included in one block between the two mutually-adjacent insulating plates 31 (referring to FIG. 1), are classified as four groups G0 to G3. The columnar members 40 that belong to each group are disposed in a region having a band configuration extending in the X-direction. In other words, the positions in the Y-direction of the columnar members 40 belonging to one group are respectively different from the positions in the Y-direction of the columnar members 40 belonging to another group. Therefore, the columnar members 40 that belong to the same group pierce the same insulating portion 25b; and the columnar members 40 that belong to mutually-different groups pierce mutually-different insulating portions 25b.

The columnar members 40 that belong to the group G0 pierce the electrode film SGD2C, the electrode film SGD3L, the electrode film SGD4L, and the electrode film SGD5L.

The columnar members 40 that belong to the group G1 pierce the electrode film SGD2R, the electrode film SGD3C, the electrode film SGD4L, and the electrode film SGD5L.

The columnar members 40 that belong to the group G2 pierce the electrode film SGD2R, the electrode film SGD3R, the electrode film SGD4C, and the electrode film SGD5L.

The columnar members 40 that belong to the group G3 pierce the electrode film SGD2R, the electrode film SGD3R, the electrode film SGD4R, and the electrode film SGD5C.

Although an example is shown in the embodiment in which the columnar members 40 in the region interposed between the two insulating plates 31 are classified as the four groups G0 to G3 and the insulating portions 25b are provided in four electrode films 25, the invention is not limited thereto. In other words, the columnar members 40 may be classified as three or fewer groups or five or more groups. In such a case, at least the same number of insulating portions 25b as the number of groups is provided and disposed at different positions in the Y-direction.

Stated more generally, in the case where the columnar members 40 are classified as n groups wherein n is an integer of 2 or more, at least n electrode films 25 in which the insulating portion 25b is provided are disposed between at least two electrode films 25 in which the insulating portion is not provided. Then, when piercing the electrode films 25 functioning as the drain-side select gates (SGD), each of the columnar members 40 pierces the insulating portion 25b of one electrode film 25 and pierces the conductive portion 25a or the conductive portion 25c of the remaining (n−1) electrode films 25. Also, the columnar members 40 that belong to the same group pierce the same insulating portion 25b; and the columnar members 40 that belong to a different group pierce a different insulating portion 25b. In the configuration recited above, the entire region of the electrode film 25 can function artificially as the drain-side select gate (SGD) as described below even though the insulating portion 25b is provided in the electrode film 25 and interposed between the conductive portion 25a and the conductive portion 25c; and such a configuration is particularly effective in the case where n is an integer of 3 or more and the integration of the memory cell transistors in the region interposed between the two insulating plates 31 is increased.

The configuration of the columnar member 40 will now be described.

Figure 4:
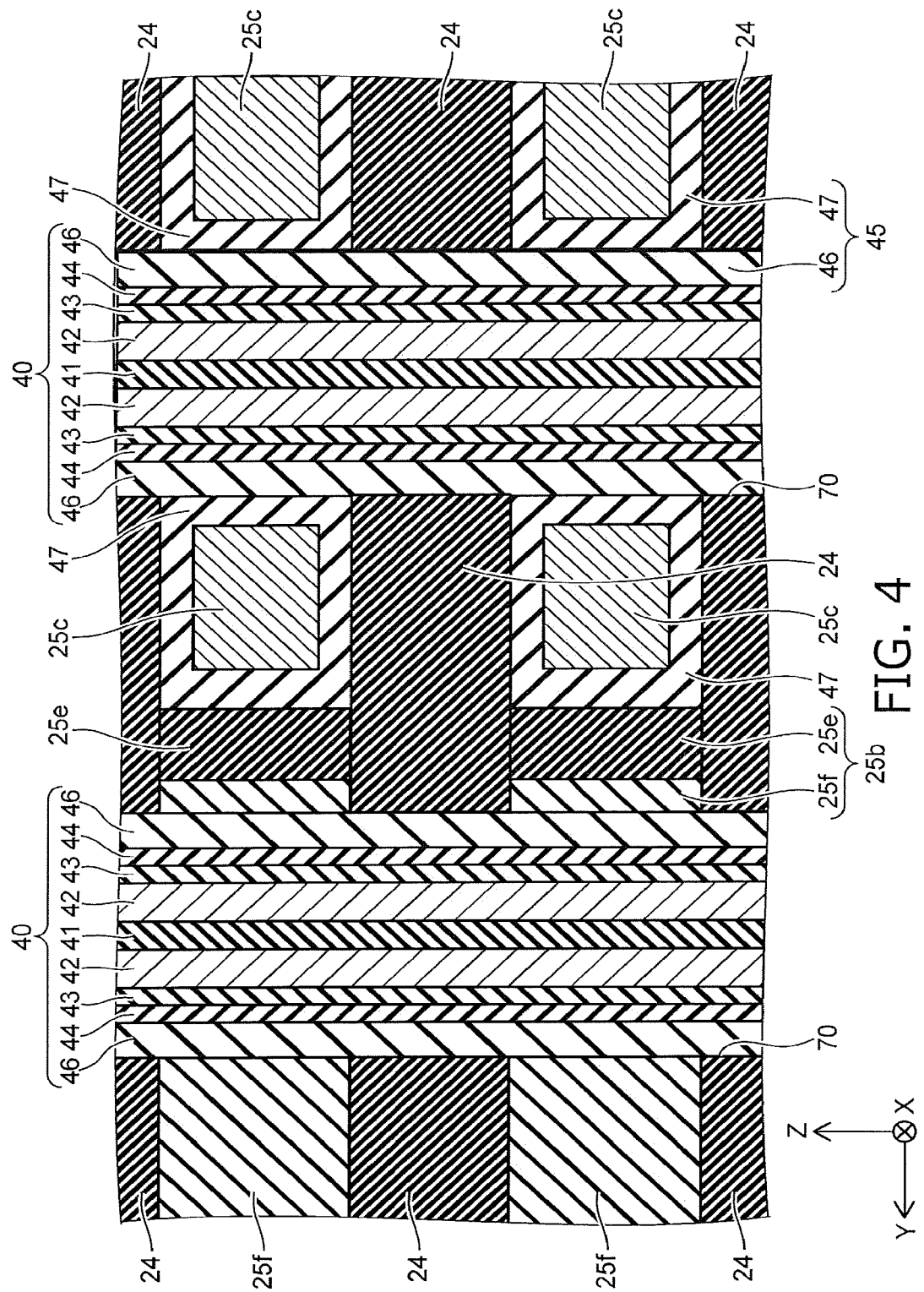
FIG. 4 is a cross-sectional view showing the columnar member and peripheral portion of the columnar member of the embodiment.

FIG. 4 is a cross-sectional view showing the columnar member and the peripheral portion of the columnar member of the embodiment.

As shown in FIG. 4, a core member 41 that is made of, for example, silicon oxide is provided in the columnar member 40. The configuration of the core member 41 is a substantially circular column. A silicon pillar 42 is provided as a semiconductor member on the side surface of the core member 41. The configuration of the silicon pillar 42 is, for example, a circular tube. The lower end portion of the silicon pillar 42 is connected to the source electrode film 20. A tunneling insulating film 43, a charge storage film 44, and a silicon oxide layer 46 are provided in this order on the side surface of the silicon pillar 42. The tunneling insulating film 43, the charge storage film 44, and the silicon oxide layer 46 are disposed on substantially the entire side surface of the silicon pillar 42; and the configurations of the tunneling insulating film 43, the charge storage film 44, and the silicon oxide layer 46 are circular tubes. The columnar member 40 includes the core member 41, the silicon pillar 42, the tunneling insulating film 43, the charge storage film 44, and the silicon oxide layer 46.

On the other hand, an aluminum oxide layer 47 is formed on the upper surface of the electrode film 25, on the lower surface of the electrode film 25, and on the side surface of the electrode film 25 facing the silicon pillar 42. For the electrode film 25 that is made of the conductive portion 25a, the insulating portion 25b, and the conductive portion 25c, the aluminum oxide layer 47 is formed on the upper surfaces of the conductive portions 25a and 25c, on the lower surfaces of the conductive portions 25a and 25c, on the side surfaces of the conductive portions 25a and 25c facing the silicon pillar 42, and on the side surfaces of the conductive portions 25a and 25c facing the end portion 25e. However, the aluminum oxide layer 47 is not formed on the upper surface of the insulating portion 25b or on the lower surface of the insulating portion 25b. A blocking insulating film 45 is formed of the silicon oxide layer 46 and the aluminum oxide layer 47.

Although the tunneling insulating film 43 normally is insulative, the tunneling insulating film 43 is a film in which a tunneling current flows when a prescribed voltage within the range of the drive voltage of the semiconductor memory device 1 is applied and is, for example, a single-layer silicon oxynitride film or an ONO film in which a silicon oxide layer, a silicon nitride layer, and a silicon oxide layer are stacked in this order. The charge storage film 44 is a charge storage member that can store a charge, is made from, for example, a material having trap sites of electrons, and is made of, for example, silicon nitride (SiN). The blocking insulating film 45 is a film in which a current substantially does not flow even when a voltage within the range of the drive voltage of the semiconductor memory device 1 is applied. Thus, a memory cell that is formed at each crossing portion between the electrode films 25 and the columnar members 40 has a vertical transistor structure in which the periphery of the silicon pillar 42 is surrounded with the electrode film 25 used to form the word line (WL) so that a memory film including the tunneling insulating film 43, the charge storage film 44, and the blocking insulating film 45 is interposed. In other words, in the memory cell that has the vertical transistor structure, the silicon pillar 42 is, for example, a channel body; and the electrode film 25 functions as a control gate. The charge storage film 44 functions as a data storage layer that stores the charge injected from the silicon pillar 42.

As shown in FIG. 1, an insulating film 50 that is made of, for example, silicon oxide is provided on the stacked body 30; and a plug 51 and a bit line 52 are provided inside the insulating film 50. The bit line 52 extends in the Y-direction and is connected to the silicon pillar 42 via the plug 51. Among the columnar members 40 belonging to each of the groups G0 to G3, the silicon pillar 42 of one columnar member 40 is connected to one bit line 52. In other words, one silicon pillar 42 belonging to the group G0, one silicon pillar 42 belonging to the group G1, one silicon pillar 42 belonging to the group G2, and one silicon pillar 42 belonging to the group G3 are connected to one bit line 52.

A method for driving the semiconductor memory device according to the embodiment will now be described.

FIG. 5 to FIG. 8 are schematic cross-sectional views showing the method for driving the semiconductor memory device according to the embodiment.

In the semiconductor memory device 1 according to the embodiment as shown in FIG. 1 to FIG. 4, the memory cell transistors are formed at the crossing portions between the word lines (WL) and the columnar members 40. Source-side select transistors are formed at the crossing portions between the source-side select gates (SGS) and the columnar members 40. Drain-side select transistors are formed at the crossing portions between the drain-side select gates (SGD) and the columnar members 40. Then, the programming, reading, and erasing of data to and from the memory cell transistors are performed by the drive circuit 15 supplying the prescribed potentials to the source electrode film 20, the electrode film 22, the electrode films 25, and the bit lines 52.

In the program operation, the drive circuit 15 sets the source-side select transistors to the nonconducting state by applying an off-potential to the source-side select gates (SGS), applies, for example, a ground potential to the selected one bit line 52, sets the drain-side select transistors belonging to the selected one group of the groups G0 to G3 to the conducting state, sets the drain-side select transistors belonging to the other groups to the nonconducting state, and applies a programming potential that is higher than the potential of the bit line 52 to the selected one word line (WL). Thereby, in the selected memory cell transistor, electrons are injected from the silicon pillar 42 into the charge storage film 44 via the tunneling insulating film 43; and a value is programmed to the memory cell transistor. At this time, multiple bits may be programmed to the memory cell transistor by precisely controlling the threshold of the memory cell transistor by finely adjusting the potentials applied to the electrode film SGD7 and the electrode film SGD8.

In the read operation, the drive circuit 15 applies, for example, the ground potential to the source electrode film 20, sets the source-side select transistors to the conducting state by applying an on-potential to the source-side select gates (SGS), applies a potential that is slightly higher than the potential of the source electrode film 20 to the selected one bit line 52, sets the drain-side select transistors belonging to the selected one group of the groups G0 to G3 to the conducting state, sets the drain-side select transistors belonging to the other groups to the nonconducting state, applies a read potential to the selected one word line (WL) so that the current that flows is different according to the value programmed to the memory cell transistor, and applies a conduction potential to the other word lines (WL) so that a current flows regardless of the values programmed to the memory cell transistors. Also, by applying an appropriate potential to the electrode film 22, a channel layer is induced in the portions of the silicon pillars 42 surrounded with the electrode film 22; and the portions are set to a state in which the electrons can flow. Then, the value that is programmed to the selected memory cell transistor is read by evaluating the magnitude of the current flowing in the source electrode film 20 from the bit line 52.

Thus, in the program operation and the read operation, the drain-side select transistors that belong to one group of the groups G0 to G3 are set to the conducting state; and the drain-side select transistors that belong to the other groups are set to the nonconducting state. In other words, a common potential is applied to the electrode films 25 functioning as the word lines (WL) in the regions corresponding to each of the groups G0 to G3; and on the other hand, particularly for the electrode films 25 including the conductive portions 25*a* and 25*c* insulated from each other by the insulating portion 25*b*, one group of the groups G0 to G3 is selected by individually controlling the potentials of the conductive portions 25*a* and 25*c*. These operations will now be described. The erase operation is performed collectively for the entire block; therefore, the selection of the group is unnecessary.

The potentials that the drive circuit 15 applies to the electrode films SGD to select the groups will now be described.

An off-potential Voff is a potential such that the drain-side select transistors formed at the crossing portions between the electrode film SGD and the columnar members 40 are set to the nonconducting state by applying the off-potential Voff to the electrode film SGD. An on-potential Von is a potential such that the drain-side select transistors formed at the crossing portions between the electrode film SGD and the columnar members 40 are set to the conducting state by applying the on-potential Von to the electrode film SGD. A high on-potential VonH is a potential such that the drain-side select transistors formed at the crossing portions between the insulating portion 25*b* and the columnar members 40 are set to the conducting state by a fringe electric field caused by applying the high on-potential VonH to the two electrode films SGD having the insulating portion 25*b* interposed between the two electrode films SGD in the Z-direction. In an example, the off-potential Voff is the ground potential (0 V (volts)); the on-potential Von is 4 to 5 V; and the high on-potential VonH is 6 to 7 V. However, the on-potentials Von that are applied to the electrode film SGD7 and the electrode film SGD8 may be finely adjusted according to the value programmed to the memory cell transistor.

Figure 5:
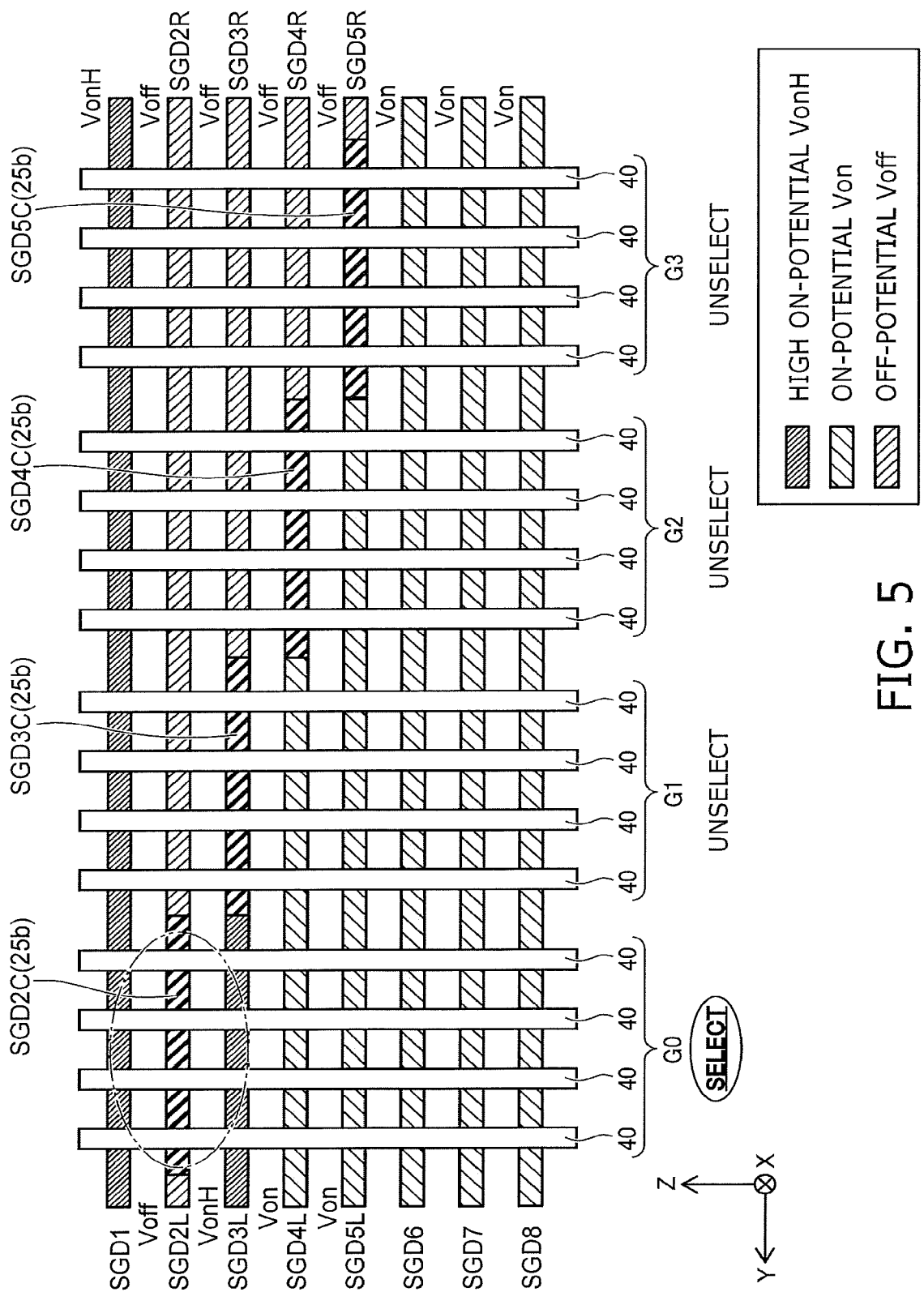
FIG. 5 is a schematic cross-sectional view showing a method for driving the semiconductor memory device according to the embodiment.

As shown in FIG. 5, in the case where the group G0 is selected, the high on-potential VonH is applied to the electrode films SGD1 and SGD3L. Thereby, the drain-side select transistors that are formed at the crossing portions between the columnar members 40 belonging to the group G0 and the electrode film SGD2C interposed between the electrode film SGD1 and the electrode film SGD3L in the Z-direction are set to the conducting state by the fringe electric field of the electrode films SGD1 and SGD3L. Also, the drain-side select transistors that are formed at the crossing portions between the electrode film SGD1 and these columnar members 40 and the drain-side select transistors formed at the crossing portions between the electrode film SGD3L and these columnar members 40 are set to the conducting state.

The on-potential Von is applied to the electrode films SGD4L, SGD5L, SGD6, SGD7, and SGD8. Thereby, the drain-side select transistors that are formed respectively at the crossing portions between the electrode films SGD4L, SGD5L, SGD6, SGD7, and SGD8 and the columnar members 40 belonging to the group G0 also are set to the conducting state. As a result, all of the drain-side select transistors of the columnar members 40 belonging to the group G0 are set to the conducting state; and the group G0 is selected.

On the other hand, the off-potential Voff is applied to the electrode films SGD2L, SGD2R, SGD3R, SGD4R, and SGD5R. At this time, the drain-side select transistors that are formed at the crossing portions between the insulating portion 25b and the columnar members 40 belonging to the groups G1 to G3 are set to the nonconducting state because a fringe electric field high enough to set the conducting state is not applied. Also, the drain-side select transistors that are formed respectively at the crossing portions between the electrode films SGD2R, SGD3R, and SGD4R and the columnar members 40 belonging to the groups G1 to G3 are set to the nonconducting state. Therefore, at least one of the drain-side select transistors of each of the columnar members 40 belonging to the groups G1 to G3 is set to the nonconducting state. As a result, the groups G1 to G3 are not selected.

Figure 6:
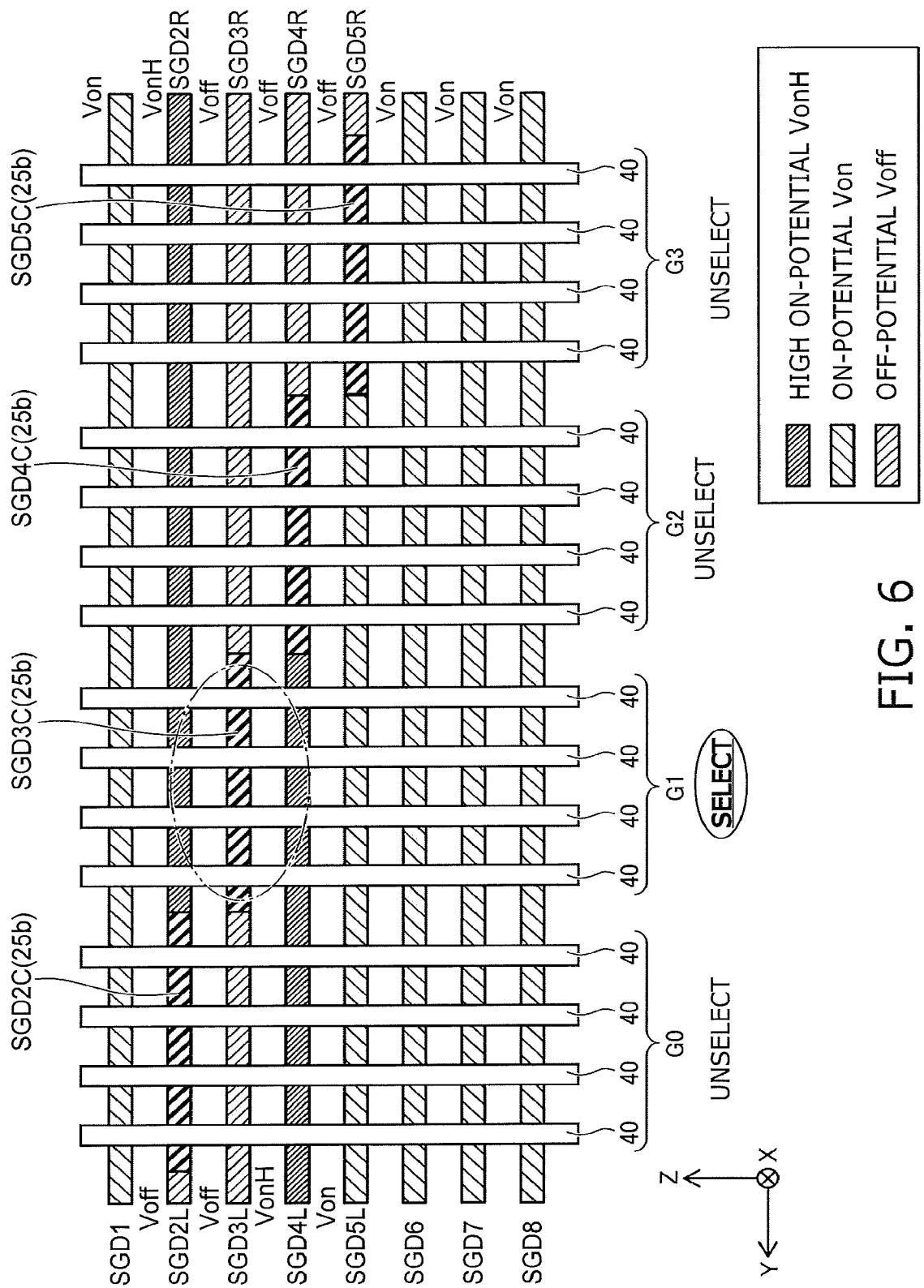
FIG. 6 is a schematic cross-sectional view showing a method for driving the semiconductor memory device according to the embodiment.

As shown in FIG. 6, in the case where the group G1 is selected, the high on-potential VonH is applied to the electrode films SGD2R and SGD4L. Thereby, the drain-side select transistors that are formed at the crossing portions between the columnar members 40 belonging to the group G1 and the electrode film SGD3C interposed between the electrode film SGD2R and the electrode film SGD4L in the Z-direction are set to the conducting state by the fringe electric field of the electrode films SGD2R and SGD4L. The drain-side select transistors that are formed at the crossing portions between the electrode film SGD2R and these columnar members 40 and the drain-side select transistors that are formed at the crossing portions between the electrode film SGD4L and these columnar members 40 also are set to the conducting state.

The on-potential Von is applied to the electrode films SGD1, SGD5L, SGD6, SGD7, and SGD8. Thereby, the drain-side select transistors that are formed respectively at the crossing portions between the electrode films SGD1, SGD5L, SGD6, SGD7, and SGD8 and the columnar members 40 belonging to the group G1 also are set to the conducting state. As a result, all of the drain-side select transistors of the columnar members 40 belonging to the group G1 are set to the conducting state; and the group G1 is selected.

On the other hand, the off-potential Voff is applied to the electrode films SGD2L, SGD3L, SGD3R, SGD4R, and SGD5R. At this time, the drain-side select transistors that are formed at the crossing portions between the insulating portion 25b and the columnar members 40 belonging to the groups G0, G2, and G3 are set to the nonconducting state because a fringe electric field high enough to set the conducting state is not applied. The drain-side select transistors that are formed respectively at the crossing portions between the electrode films SGD3L, SGD3R, and SGD4R and the columnar members 40 belonging to the groups G0, G2, and G3 also are set to the nonconducting state. Therefore, at least one of the drain-side select transistors of each of the columnar members 40 belonging to the groups G0, G2, and G3 is set to the nonconducting state. As a result, the groups G0, G2, and G3 are not selected.

Figure 7:
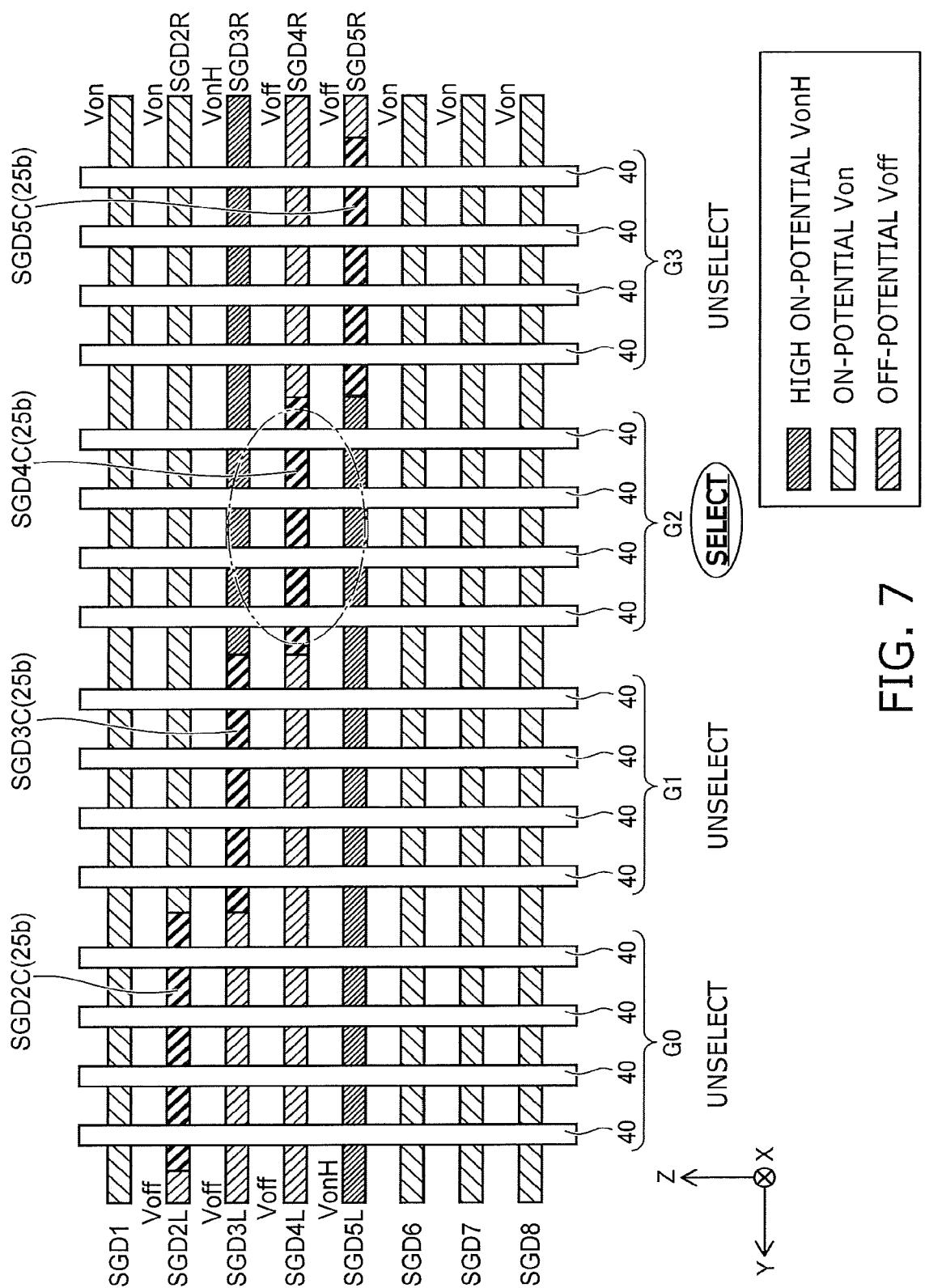
FIG. 7 is a schematic cross-sectional view showing a method for driving the semiconductor memory device according to the embodiment.

As shown in FIG. 7, in the case where the group G2 is selected, the high on-potential VonH is applied to the electrode films SGD3R and SGD5L. Thereby, the drain-side select transistors that are formed at the crossing portions between the columnar members 40 belonging to the group G2 and the electrode film SGD4C interposed between the electrode film SGD3R and the electrode film SGD5L in the Z-direction are set to the conducting state by the fringe electric field of the electrode films SGD3R and SGD5L. The drain-side select transistors that are formed at the crossing portions between the electrode film SGD3R and these columnar members 40 and the drain-side select transistors that are formed at the crossing portions between the electrode film SGD5L and these columnar members 40 also are set to the conducting state.

The on-potential Von is applied to the electrode films SGD1, SGD2R, SGD6, SGD7, and SGD8. Thereby, the drain-side select transistors that are formed respectively at the crossing portions between the electrode films SGD1, SGD2R, SGD6, SGD7, and SGD8 and the columnar members 40 belonging to the group G2 also are set to the conducting state. As a result, all of the drain-side select transistors of the columnar members 40 belonging to the group G2 are set to the conducting state; and the group G2 is selected.

On the other hand, the off-potential Voff is applied to the electrode films SGD2L, SGD3L, SGD4L, SGD4R, and SGD5R. At this time, the drain-side select transistors that are formed at the crossing portions between the insulating portion 25b and the columnar members 40 belonging to the groups G0, G1, and G3 are set to the nonconducting state because a fringe electric field high enough to set the conducting state is not applied. The drain-side select transistors that are formed respectively at the crossing portions between the electrode films SGD3L, SGD4L, and SGD4R and the columnar members 40 belonging to the groups G0, G1, and G3 also are set to the nonconducting state. Therefore, at least one of the drain-side select transistors of each of the columnar members 40 belonging to the groups G0, G1, and G3 is set to the nonconducting state.

As a result, the groups G0, G1, and G3 are not selected.

Figure 8:
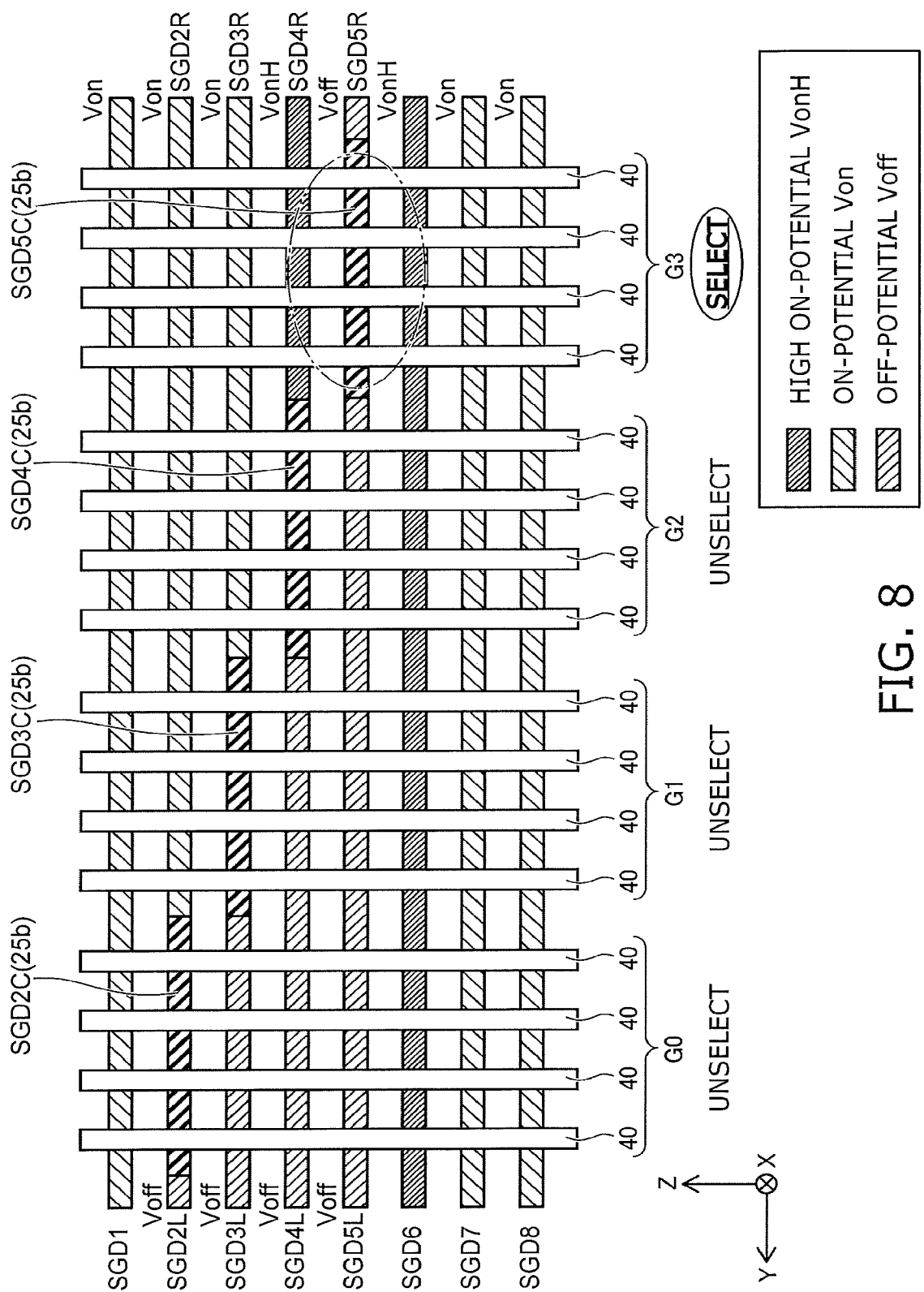
FIG. 8 is a schematic cross-sectional view showing a method for driving the semiconductor memory device according to the embodiment.

As shown in FIG. 8, in the case where the group G3 is selected, the high on-potential VonH is applied to the electrode films SGD4R and SGD6. Thereby, the drain-side select transistors that are formed at the crossing portions between the columnar members 40 belonging to the group G3 and the electrode film SGD5C interposed between the electrode film SGD4R and the electrode film SGD6 in the Z-direction are set to the conducting state by the fringe electric field of the electrode films SGD4R and SGD6. The drain-side select transistors that are formed at the crossing portions between the electrode film SGD4R and these columnar members 40 and the drain-side select transistors that are formed at the crossing portions between the electrode film SGD6 and these columnar members 40 also are set to the conducting state.

The on-potential Von is applied to the electrode films SGD1, SGD2R, SGD3R, SGD7, and SGD8. Thereby, the drain-side select transistors that are formed respectively at the crossing portions between the electrode films SGD1, SGD2R, SGD3R, SGD7, and SGD8 and the columnar members 40 belonging to the group G3 also are set to the conducting state. As a result, all of the drain-side select transistors of the columnar members 40 belonging to the group G3 are set to the conducting state; and the group G3 is selected.

On the other hand, the off-potential Voff is applied to the electrode films SGD2L, SGD3L, SGD4L, SGD5L, and SGD5R. At this time, the drain-side select transistors that are formed at the crossing portions between the insulating portion 25b and the columnar members 40 belonging to the groups G0 to G2 are set to the nonconducting state because a fringe electric field high enough to set the conducting state is not applied. The drain-side select transistors that are formed respectively at the crossing portions between the electrode films SGD3L, SGD4L, and SGD5L and the columnar members 40 belonging to the groups G0 to G2 also are set to the nonconducting state. Therefore, at least one of the drain-side select transistors of each of the columnar members 40 belonging to the groups G0 to G2 is set to the nonconducting state. As a result, the groups G0 to G2 are not selected.

Thus, by the drive circuit 15 applying the high on-potential VonH to the two electrode films SGD disposed on the two Z-direction sides of one insulating portion 25b pierced by the columnar members 40 belonging to the group to be selected, the drain-side select transistors that are formed at the crossing portions between the insulating portion 25b and the columnar members 40 are set to the conducting state. By applying the on-potential Von to the other electrode films 25 pierced by the columnar members 40 belonging to the group to be selected, the drain-side select transistors that are formed at these crossing portions also are set to the conducting state. On the other hand, the drain-side select transistors that are formed at the crossing portions between the insulating portion 25b and the columnar members 40 belonging to the other groups are not applied with a high fringe electric field and are set to the nonconducting state. Thereby, one group is selected.

A method for manufacturing the semiconductor memory device according to the embodiment will now be described.

FIG. 9A to FIG. 17 are cross-sectional views showing the method for manufacturing the semiconductor memory device according to the embodiment.

In FIG. 9A to FIG. 17, only portions corresponding to the drain-side select gates are shown; and the other portions are not illustrated.

First, as shown in FIG. 1, STI (Shallow Trench Isolation), diffusion layers, etc., are formed in the upper layer portion of the silicon substrate 10. Then, gate electrodes, etc., are formed on the silicon substrate 10. Thereby, MOSFETs 12 are formed. Then, the inter-layer insulating film 11, the interconnect 13, contacts, vias, etc., are formed on the silicon substrate 10. Thereby, the drive circuit 15 is formed. Then, the source electrode film 20, the insulating film 21, and the electrode film 22 are formed on the inter-layer insulating film 11.

Continuing, for example, the insulating films 24 that are made of silicon oxide (SiO) and sacrificial films 61 that are made of silicon nitride (SiN) are stacked alternately by CVD (Chemical Vapor Deposition); and the electrode films 25 up to the electrode film 25 directly under the electrode film SGD8 used to form the drain-side select gate (SGD) of the lowermost layer, i.e., up to the electrode film 25 of the ninth level from the top of the stacked body 30 are formed. However, in the stacked body 30 at this stage, instead of the electrode films 25, for example, silicon nitride films are formed as the sacrificial films 61 to be replaced with the electrode films 25 in a subsequent process. Further, the sacrificial films 61 up to the sacrificial film 61 to be replaced with the electrode film SGD5 are formed as shown in FIG. 9A by repeating the process of alternately forming the insulating film 24 and the sacrificial film 61.

Continuing as shown in FIG. 9B, two trenches 62a are formed at the two Y-direction end portions of a region corresponding to the group G3 by lithography and RIE (Reactive Ion Etching). The sacrificial film 61 of the uppermost level, i.e., the sacrificial film 61 to be replaced with the electrode film SGD5, is divided by the trenches 62a. Thereby, the sacrificial film 61 of the uppermost level is divided by the two trenches 62a into a portion corresponding to the electrode film SGD5L, a portion corresponding to the electrode film SGD5C, and a portion corresponding to the electrode film SGD5R.

Figure 10A:
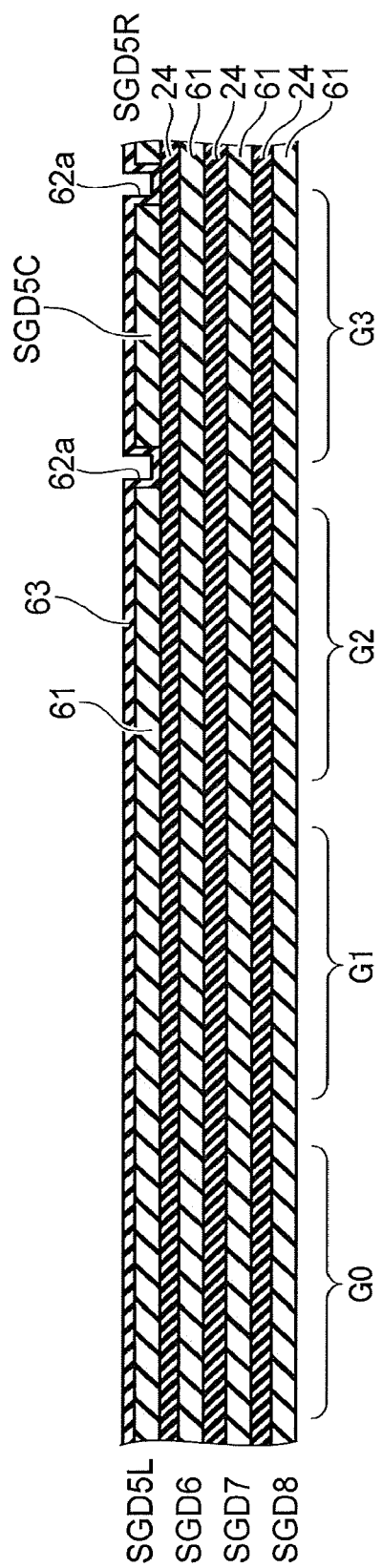
FIGS. 10A and 10B are cross-sectional views showing a method for manufacturing the semiconductor memory device according to the embodiment.

Continuing as shown in FIG. 10A, a silicon nitride film 63 is formed on the entire surface. Although the silicon nitride film 63 also is formed on the inner surfaces of the trenches 62a, the thickness of the silicon nitride film 63 is such that the trenches 62a are not completely filled.

Figure 10B:
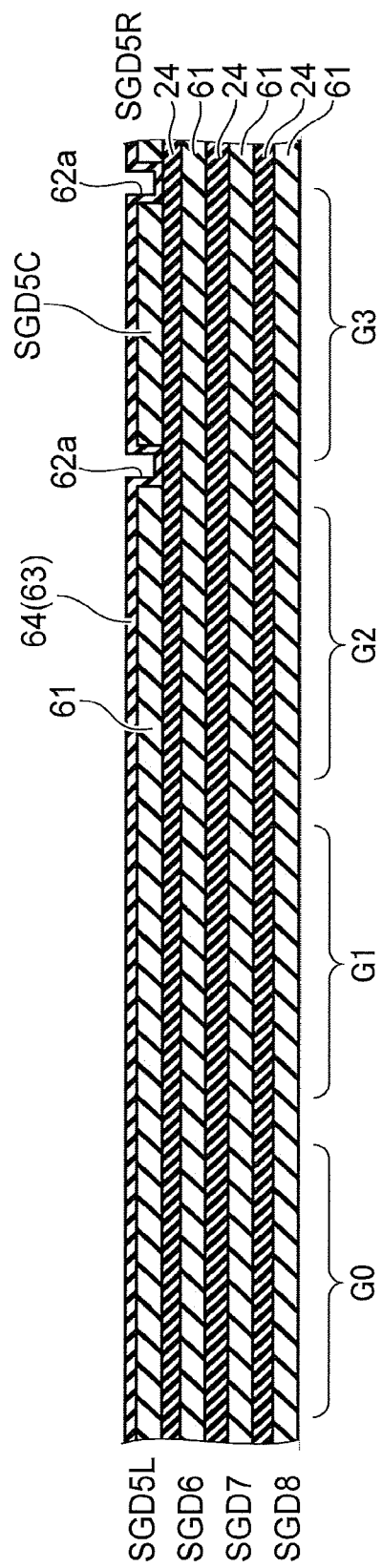

Then, as shown in FIG. 10B, thermal oxidation treatment of the silicon nitride film 63 is performed. Thereby, the silicon nitride film 63 is changed into a silicon thermal oxide film 64.

Figure 11A:
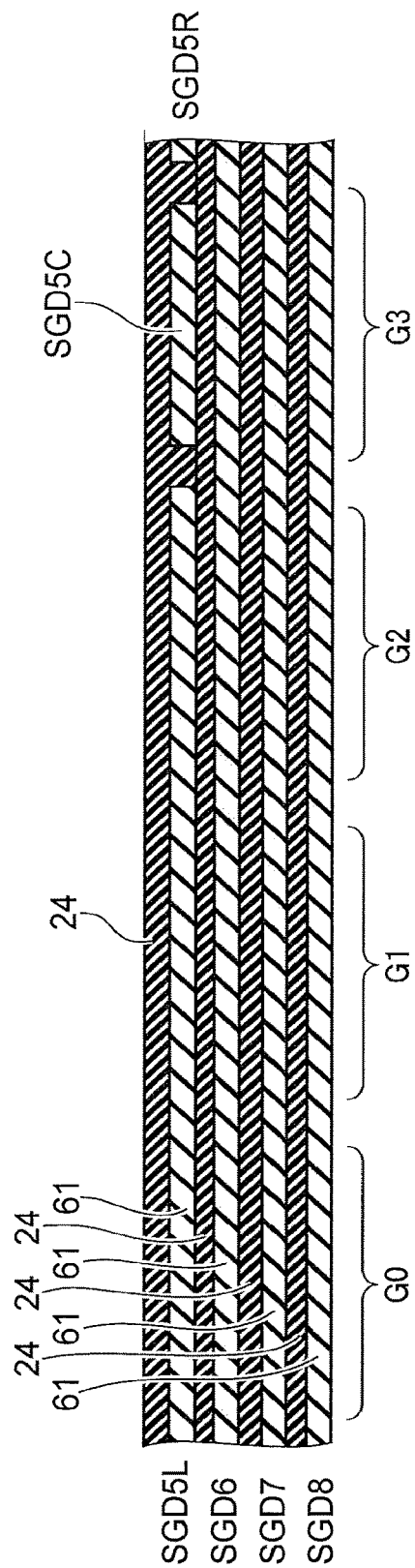
FIGS. 11A and 11B are cross-sectional views showing a method for manufacturing the semiconductor memory device according to the embodiment.

Continuing as shown in FIG. 11A, for example, the insulating film 24 is formed by depositing silicon oxide by CVD. The insulating film 24 also is filled into the trenches 62a. The insulating film 24 is formed as one body with the silicon thermal oxide film 64 (referring to FIG. 10B). In the subsequent drawings, the silicon thermal oxide film 64 is shown as a portion of the insulating film 24.

Figure 11B:
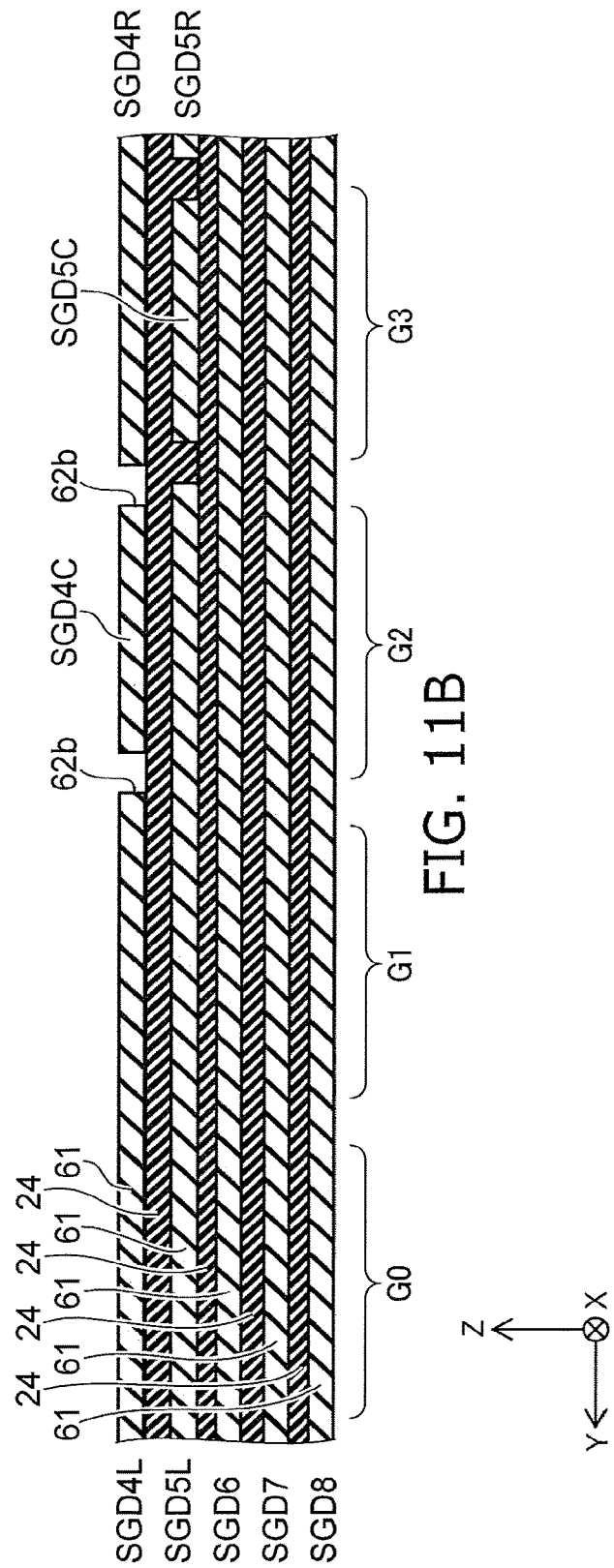

Continuing as shown in FIG. 11B, one sacrificial film 61 is formed by depositing silicon nitride. This sacrificial film 61 is replaced with the electrode films SGD4L and SGD4R in a subsequent process. Then, two trenches 62b are formed at the two Y-direction end portions of a region corresponding to the group G2 by lithography and RIE. The sacrificial film 61 of the uppermost level is divided by the trenches 62b. Thereby, the sacrificial film 61 of the uppermost level is divided into a portion corresponding to the electrode film SGD4L, a portion corresponding to the electrode film SGD4C, and a portion corresponding to the electrode film SGD4R.

Thereafter, similar processes are repeated. Namely, similarly to the processes shown in FIGS. 10A and 10B, a silicon nitride film is formed on the entire surface; and the silicon nitride film is changed into a silicon thermal oxide film by performing thermal oxidation treatment. Then, similarly to the process shown in FIG. 11A, the insulating film 24 is formed by depositing silicon oxide.

Then, similarly to the process shown in FIG. 11B, one sacrificial film 61 is formed; and trenches 62c are formed at the two Y-direction end portions of a region corresponding to the group G1 by lithography and RIE. Thereby, the one sacrificial film 61 is divided by the two trenches 62c into a portion corresponding to the electrode film SGD3L, a portion corresponding to the electrode film SGD3C, and a portion corresponding to the electrode film SGD3R.

Figure 12:
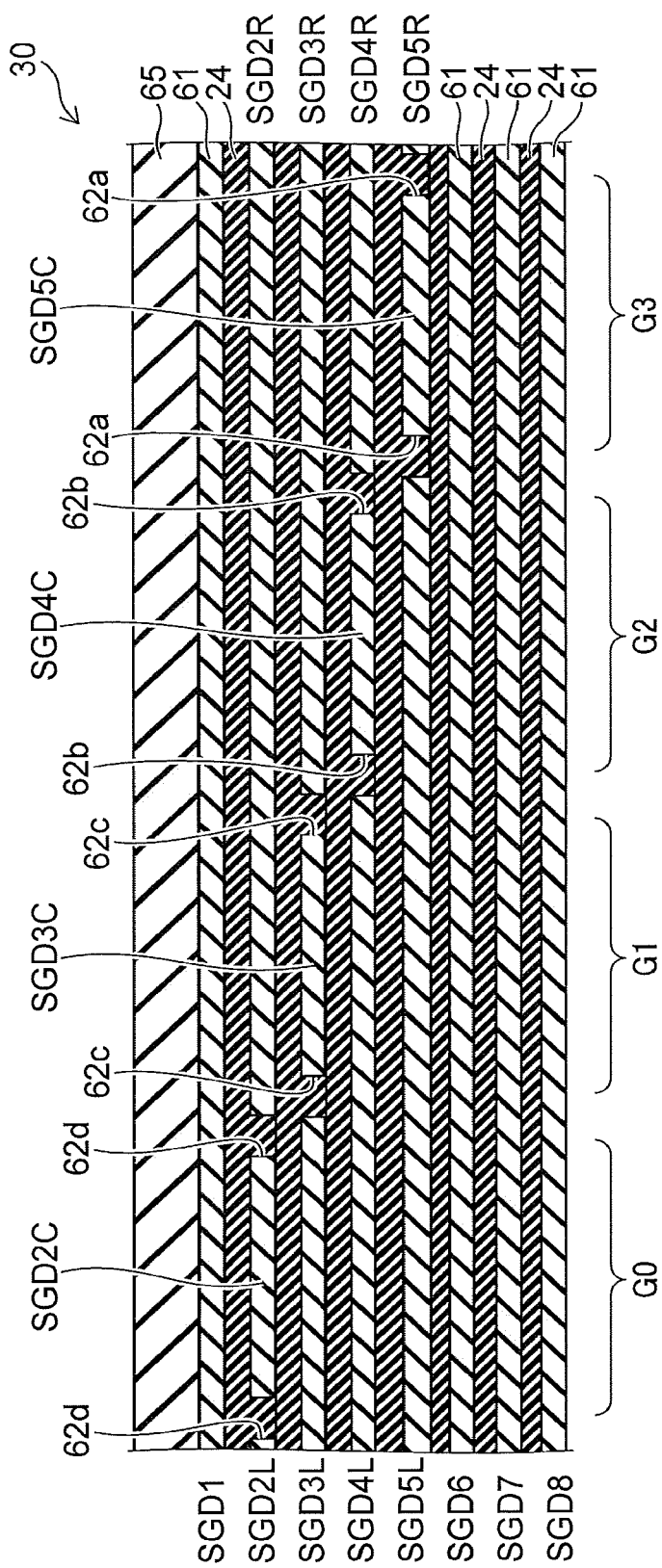
FIG. 12 is a cross-sectional view showing a method for manufacturing the semiconductor memory device according to the embodiment.

Further, by repeating similar processes, the insulating film 24 that fills the interiors of the trenches 62c and the sacrificial film 61 are sequentially formed; two trenches 62d are formed in the newly formed one sacrificial film 61; and the one sacrificial film 61 is divided into a portion corresponding to the electrode film SGD2L, a portion corresponding to the electrode film SGD2C, and a portion corresponding to the electrode film SGD2R. Then, the insulating film 24 is formed by forming the silicon nitride film 63, performing thermal oxidation treatment, and depositing silicon oxide. Then, the sacrificial film 61 that corresponds to the electrode film SGD1 is formed; and an insulating film 65 that is made of, for example, silicon oxide is formed on the sacrificial film 61. Thereby, the stacked body 30 is formed as shown in FIG. 12. In the subsequent drawings, the stacked body 30 that is shown includes the insulating film 65 that has a different thickness than the insulating film 24 and is formed on the sacrificial film 61 to be replaced with the electrode film 25 of the uppermost layer in a subsequent process.

Figure 13:
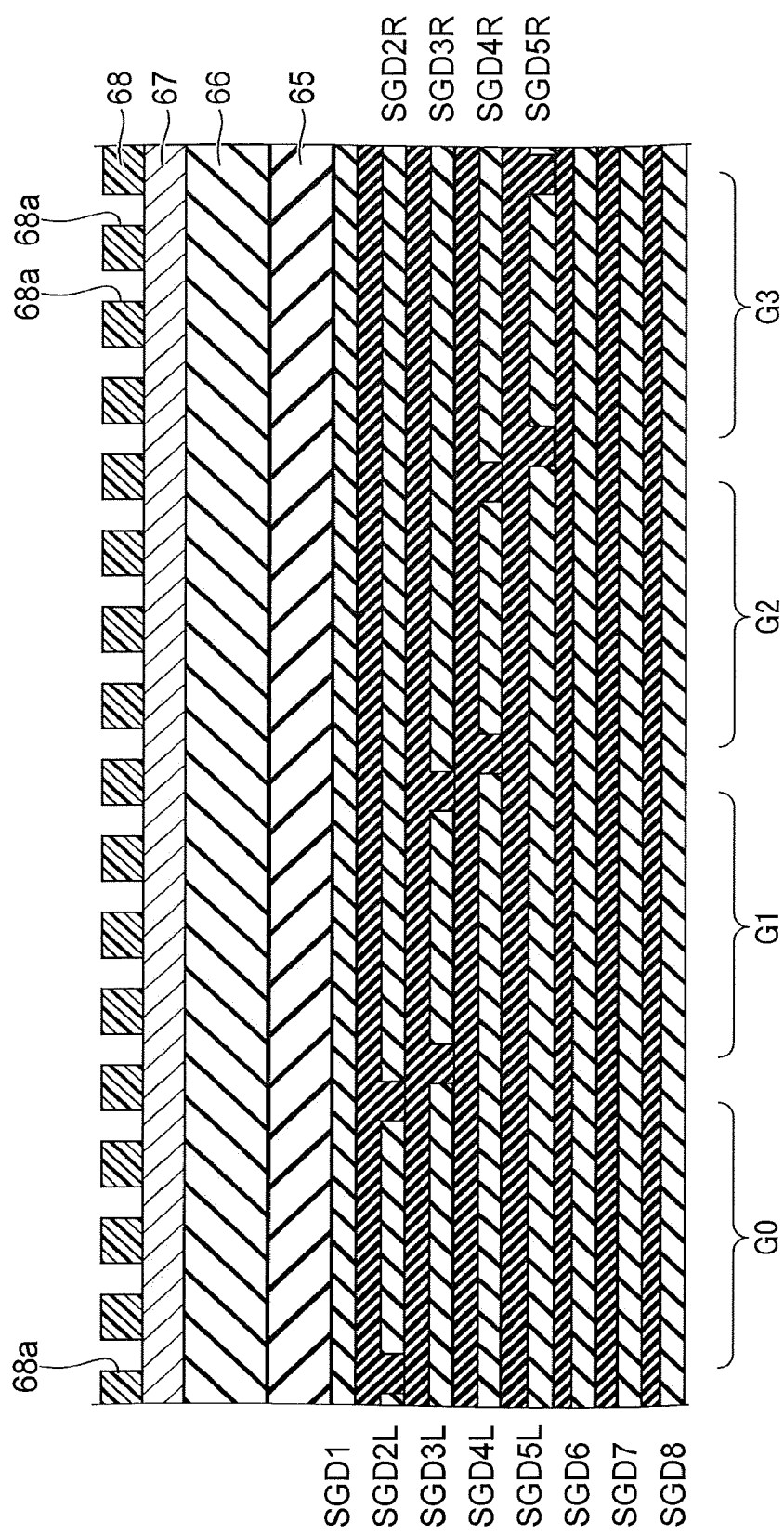
FIG. 13 is a cross-sectional view showing a method for manufacturing the semiconductor memory device according to the embodiment.

Continuing as shown in FIG. 13, an anti-reflection film 66, a hard mask film 67, and a resist film 68 are formed on the insulating film 65. Then, circular openings 68a are formed to the resist film 68 by performing exposure and development. When viewed from the Z-direction, for example, the openings 68a are arranged in a staggered configuration.

Figure 14:
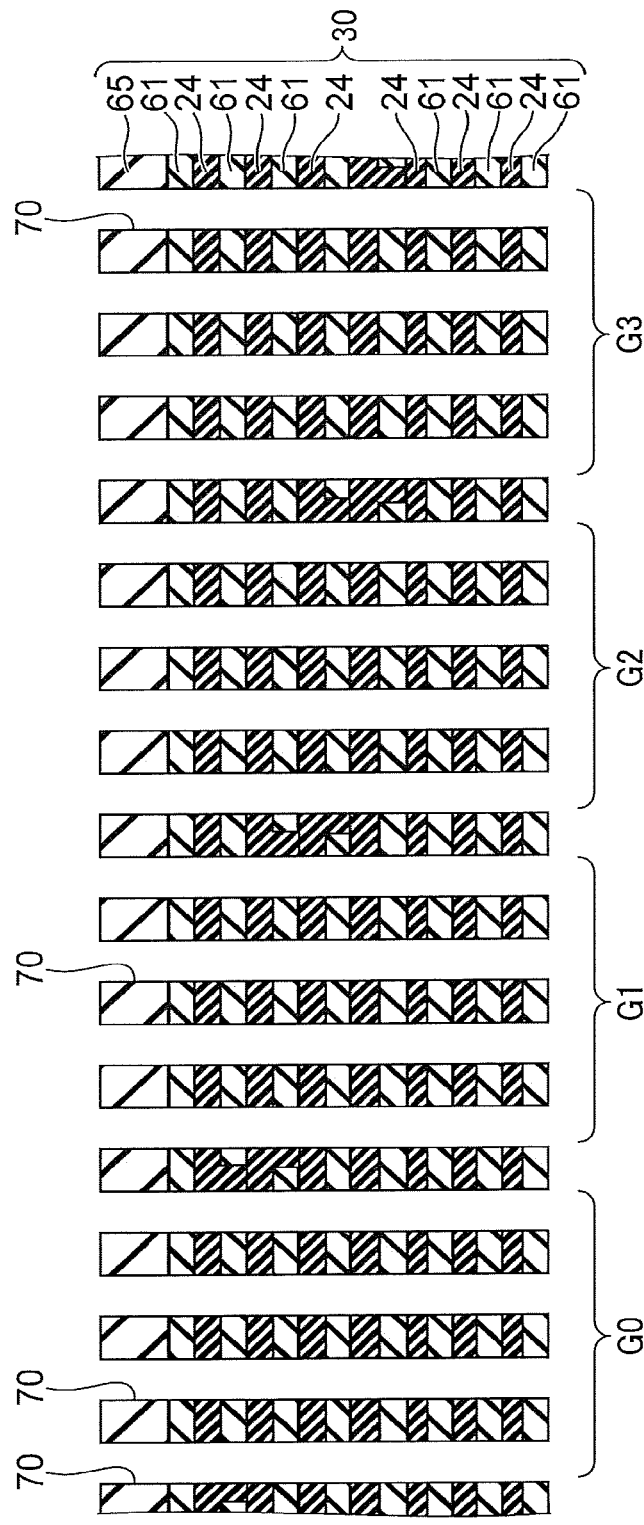
FIG. 14 is a cross-sectional view showing a method for manufacturing the semiconductor memory device according to the embodiment.

Then, as shown in FIG. 14, the hard mask film 67 (referring to FIG. 13) is patterned using the resist film 68 (referring to FIG. 13) as a mask; and the anti-reflection film 66, the stacked body 30, the electrode film 22 (referring to FIG. 1), and the insulating film 21 (referring to FIG. 1) are etched using the hard mask film 67 as a mask. Thereby, memory holes 70 are formed in the stacked body 30, the electrode film 22, and the insulating film 21. The source electrode film 20 (referring to FIG. 1) is exposed at the bottom surfaces of the memory holes 70. Here, the electrode film 22 that is made of polysilicon can function as an etching stopper for suppressing the fluctuation of the bottom surface positions of the memory holes 70 by once stopping the etching at the point in time when the memory holes 70 pierce the stacked body 30 and by subsequently continuing the etching using conditions that can etch polysilicon. Then, the resist film 68, the hard mask film 67, and the anti-reflection film 66 are removed.

Figure 15:
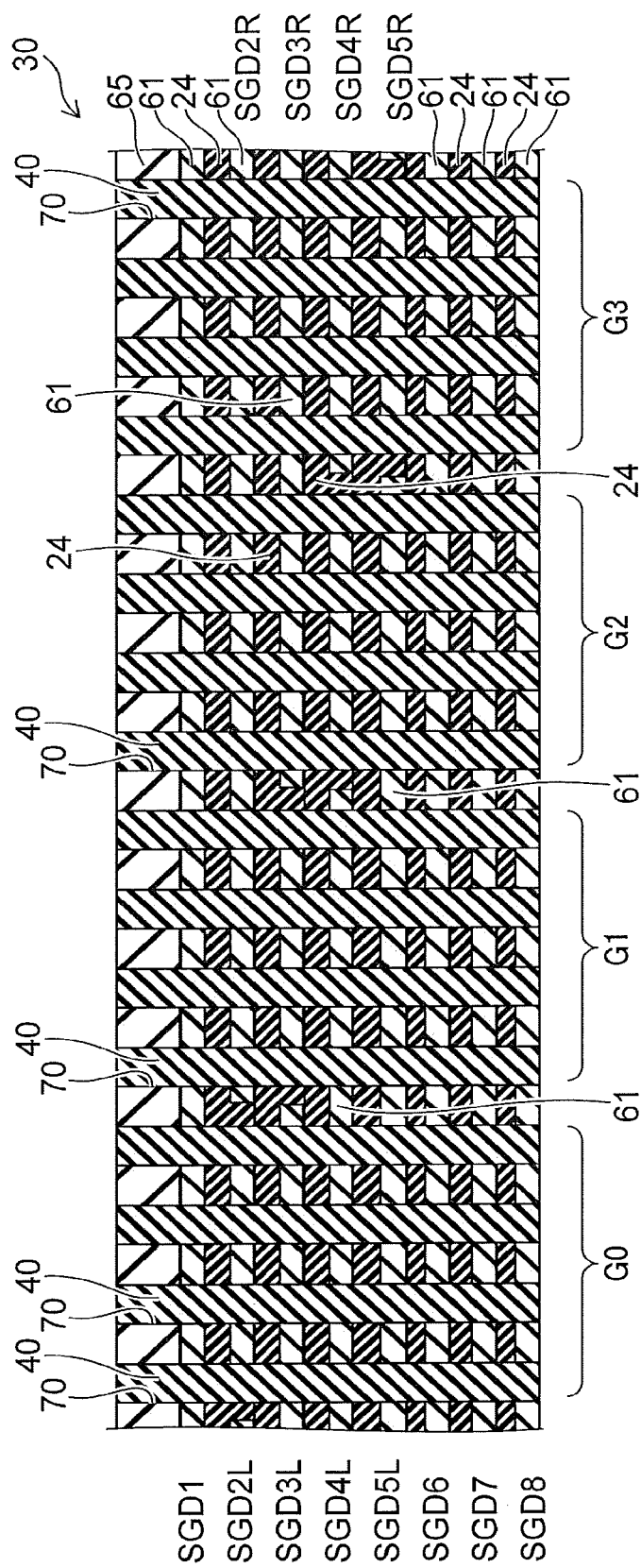
FIG. 15 is a cross-sectional view showing a method for manufacturing the semiconductor memory device according to the embodiment.

Continuing as shown in FIG. 4 and FIG. 15, the silicon oxide layer 46, the charge storage film 44, and the tunneling insulating film 43 are formed on the inner surfaces of the memory holes 70. Then, for example, the tunneling insulating film 43, the charge storage film 44, and the silicon oxide layer 46 that are on the bottom surfaces of the memory holes 70 are removed by RIE. Then, the silicon pillars 42 are formed by depositing silicon on the inner surfaces of the memory holes 70. The lower ends of the silicon pillars 42 are connected to the source electrode film 20. Then, the core members 41 are formed by filling silicon oxide into the memory holes 70. Thus, the columnar members 40 are formed inside the memory holes 70.

Figure 16:
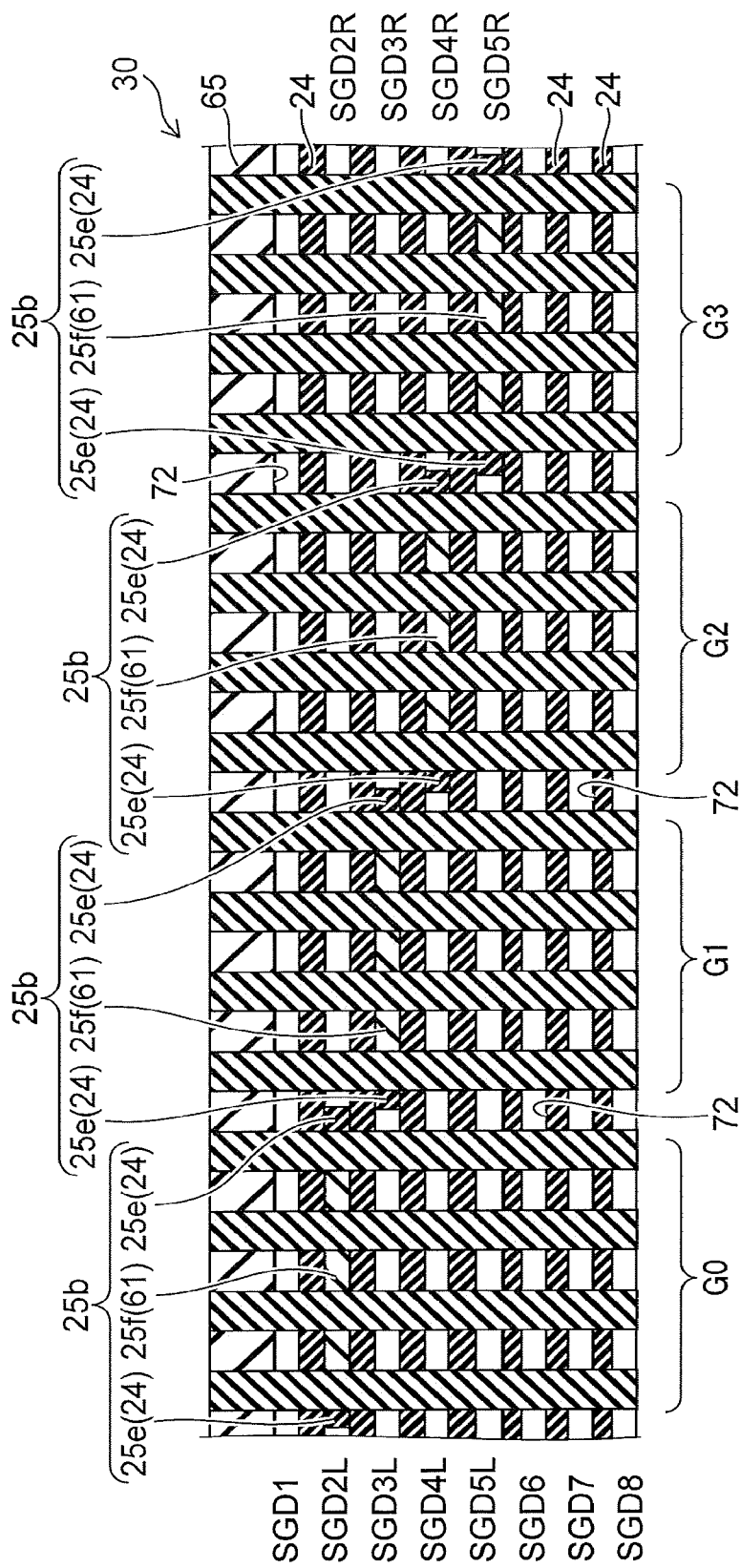
FIG. 16 is a cross-sectional view showing a method for manufacturing the semiconductor memory device according to the embodiment.

Continuing as shown in FIG. 1 and FIG. 16, a slit 71 that spreads along the XZ plane is formed in the stacked body 30, the electrode film 22, and the insulating film 21. Then, the sacrificial films 61 that are made of silicon nitride are removed by performing, for example, wet etching using hot phosphoric acid via the slit 71. Thereby, spaces 72 are formed where the sacrificial films 61 are removed. At this time, the insulating film 24 that is filled into the trenches 62a to 62d (referring to FIG. 12) includes the silicon thermal oxide film 64 (referring to FIG. 10B); therefore, the etching resistance is high; and the insulating film 24 is not consumed. Therefore, the portions of the sacrificial films 61 interposed between the trenches 62a to 62d (referring to FIG. 12) remain without being etched. Thus, the insulating portions 25b are formed. In the insulating portion 25b, the insulating film 24 that is filled into the trenches 62a to 62d becomes the end portions 25e; and the sacrificial film 61 that is interposed between the trenches 62a to 62d (referring to FIG. 12) becomes the central portion 25f.

Figure 17:
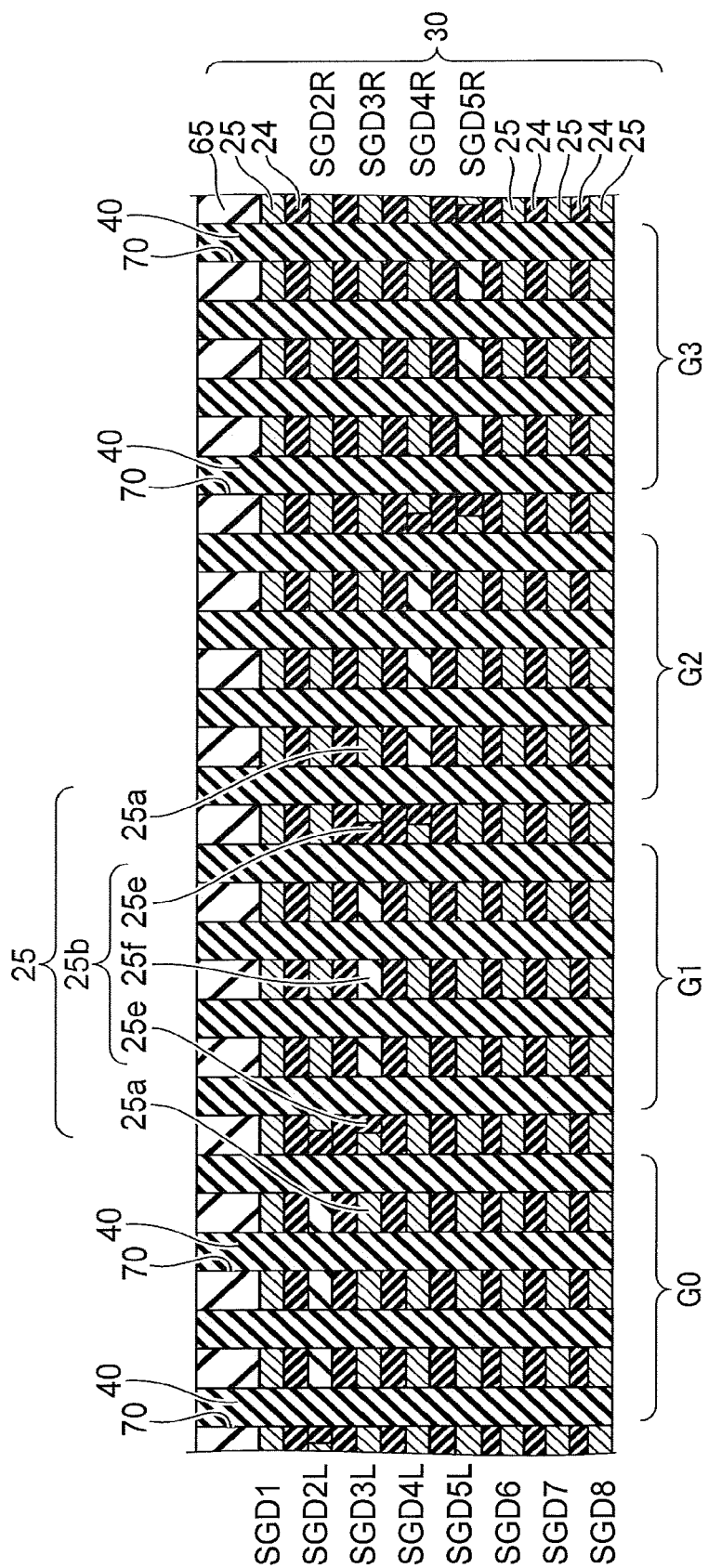
FIG. 17 is a cross-sectional view showing a method for manufacturing the semiconductor memory device according to the embodiment.

Continuing as shown in FIG. 1 and FIG. 17, aluminum oxide is deposited via the slit 71. Thereby, the aluminum oxide layer 47 (referring to FIG. 4) is formed on the inner surfaces of the spaces 72. The aluminum oxide layer 47 contacts the silicon oxide layer 46 which is the outermost layer of the columnar member 40 and is included in the blocking insulating film 45 with the silicon oxide layer 46. Then, for example, a metal material such as tungsten or the like is deposited via the slit 71. Thereby, the electrode films 25 are formed inside the spaces 72. The conductive portions 25a and 25c are formed from the deposited metal material inside the spaces 72 having the insulating portion 25b provided in the interior. Thus, the sacrificial films 61 (referring to FIG. 15) are replaced with the electrode films 25.

Continuing as shown in FIG. 1, the metal material and the aluminum oxide that are inside the slit 71 are removed; and, for example, an insulating material such as silicon oxide or the like is filled. Thereby, the insulating plate 31 is formed inside the slit 71. In the process shown in FIG. 16, the slit 71 may be formed to overlap one of the trenches 62a (referring to FIG. 9B) and one of the trenches 62d (referring to FIG. 12). In such a case, the insulating plate 31 contacts the end portion 25e of the electrode film SGD2C (25b) (referring to FIG. 3) and the end portion 25e of the electrode film SGD5C (25b) (referring to FIG. 3); and the electrode film SGD2L and the electrode film SGD5R are not formed. Then, the insulating film 50, the plugs 51, and the bit lines 52 are formed on the stacked body 30 and on the insulating plate 31. Thereby, the semiconductor memory device 1 according to the embodiment is manufactured.

Effects of the embodiment will now be described.

In the embodiment, the insulating portion 25b is provided in the electrode films 25 functioning as the drain-side select gates (SGD). Thereby, the conductive portion 25a and the conductive portion 25c can be used as independent electrodes because the conductive portion 25a and the conductive portion 25c are insulated from each other. As a result, the silicon pillars 42 that are connected to one bit line 52 can be driven separately in multiple groups. In the embodiment, by providing the insulating portion 25b in four electrode films 25, the silicon pillars 42 can be driven separately in the four groups G0 to G3.

In the embodiment, the columnar members 40 that include the silicon pillars 42 are disposed to pierce the insulating portion 25b. Thereby, the spacing of the columnar members 40 in the Y-direction can be reduced compared to the case where the insulating member for subdividing the drain-side select gates is provided at a position distal to the columnar members 40; and higher integration of the semiconductor memory device 1 can be realized.

In the embodiment, by applying the high on-potential VonH which is higher than the normal on-potential Von to the two electrode films 25 having the insulating portion 25b interposed between the two electrode films 25 in the Z-direction, the drain-side select transistors that are formed at the crossing portions between the insulating portion 25b and the columnar members 40 are set to the conducting state by the fringe electric field. Thereby, the columnar members 40 can operate as drain-side select transistors even in the case where the columnar members 40 pierce the insulating portion 25b.

In the embodiment, the central portion 25f of the insulating portion 25b is formed of silicon nitride. Because the relative dielectric constant of silicon nitride is higher than the relative dielectric constant of silicon oxide, the fringe electric field can be transmitted efficiently to the silicon pillars 42 disposed inside the central portion 25f. Also, the formation is easy because the central portion 25f can be formed by causing the sacrificial film 61 to remain.

The lower ends of the silicon pillars 42 may be connected to the silicon substrate 10 without providing the inter-layer insulating film 11 and the source electrode film 20. In such a case, the silicon substrate 10 functions as the source electrode. In such a case, the drive circuit 15 is formed at the periphery of the stacked body 30. Also, a conductive member may be provided inside the insulating plate 31; and the lower end of the conductive member may be connected to the silicon substrate 10.

According to the embodiments described above, a semiconductor memory device and a method for driving the semiconductor memory device can be realized in which the integration is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a first electrode film;
a second electrode film separated from the first electrode film in a first direction, the second electrode film including a first conductive portion, a first insulating portion, and a second conductive portion arranged along a second direction, the first insulating portion extending in a third direction and insulating the first conductive portion and the second conductive portion the second direction crossing the first direction, the third direction crossing the first direction and the second direction;
a third electrode film separated from the second electrode film in the first direction the third electrode film including a third conductive portion, a second insulating portion, and a fourth conductive portion arranged along the second direction, the second insulating portion extending in the third direction and insulating the third conductive portion and the fourth conductive portion;
a fourth electrode film separated from the third electrode film in the first direction;
a fifth electrode film separated from the fourth electrode film in the first direction;
a plurality of first semiconductor members each extending in the first direction and each piercing the first electrode film, the first insulating portion of the second electrode film, the third conductive portion or the fourth conductive portion of the third electrode film, the fourth electrode film, and the fifth electrode film;
a plurality of second semiconductor members each extending in the first direction and each piercing the first electrode film, the first conductive portion or the second conductive portion of the second electrode film, the second insulating portion of the third electrode film, the fourth electrode film, and the fifth electrode film;
a first charge storage member provided between the fifth electrode film and one of the plurality of first semiconductor members; and
a second charge storage member provided between the fifth electrode film and one of the plurality of second semiconductor members.

2. The device according to claim 1, wherein one end of the one of the plurality of first semiconductor members on the first electrode film side and one end of the one of the second semiconductor members on the first electrode film side are electrically connected to a common interconnect.

3. The device according to claim 2, further comprising a drive circuit applying a first potential to set portions of the plurality of first semiconductor members surrounded with the first insulating portion to a conducting state when selecting the plurality of first semiconductor members from among the plurality of first semiconductor members and the plurality of second semiconductor members, the first potential being applied to portions of the first electrode film and the third electrode film surrounding the plurality of first semiconductor members.

4. The device according to claim 3, wherein when selecting the plurality of first semiconductor members, the drive circuit applies, to the second electrode film, a potential to set portions of the plurality of second semiconductor members surrounded with the first conductive portion or the second conductive portion to a nonconducting state.

5. The device according to claim 2, further comprising a conductive film separated from the fifth electrode film in the first direction,
another end of the one of the plurality of first semiconductor members and another end of the one of the plurality of second semiconductor members being connected to the conductive film.

6. The device according to claim 1, further comprising:
a sixth electrode film provided between the third electrode film and the fourth electrode film and separated from the third electrode film and the fourth electrode film, the sixth electrode film including a fifth conductive portion, a third insulating portion, and a sixth conductive portion arranged along the second direction;
a plurality of third semiconductor members each extending in the first direction and each piercing the first electrode film, the first conductive portion or the second conductive portion of the second electrode film, the third conductive portion or the fourth conductive portion of the third electrode film, the third insulating portion of the sixth electrode film, the fourth electrode film, and the fifth electrode film; and
a third charge storage member provided between the fifth electrode film and one of the third semiconductor members,
the plurality of first semiconductor members each piercing the fifth conductive portion or the sixth conductive portion of the sixth electrode film,
the plurality of second semiconductor members each piercing the fifth conductive portion or the sixth conductive portion of the sixth electrode film.

7. The device according to claim 6, further comprising a drive circuit applying a first potential to set a portion of the plurality of first semiconductor members surrounded with the second insulating portion of the second electrode film to a conducting state when selecting the plurality of first to third semiconductor members from among the plurality of first to third semiconductor members, the first potential being applied to a portion of the first electrode film surrounding the plurality of first semiconductor members and to the third conductive portion or the fourth conductive portion of the third electrode film.

8. The device according to claim 7, wherein
the drive circuit applies a second potential to set a portion of the plurality of first semiconductor members surrounded with the sixth electrode film to a conducting state when selecting the first semiconductor member, the second potential being lower than the first potential and being applied to a portion of the sixth electrode film surrounding the plurality of first semiconductor members.

9. The device according to claim 6,
further comprising a drive circuit applying a first potential to set a portion of the second semiconductor member surrounded with the second insulating portion of the third electrode film to a conducting state when selecting the plurality of second semiconductor members from among the plurality of first to third semiconductor members, the first potential being applied to a portion of the sixth electrode film surrounding the plurality of second semiconductor members and the first conductive portion or the second conductive portion of the second electrode film.

10. The device according to claim 9, wherein when selecting the plurality of second semiconductor members, the drive circuit applies, to the third conductive portion and the fourth conductive portion of the third electrode film, a potential to set a portion of the plurality of first semiconductor members surrounded with the third conductive portion or the fourth conductive portion of the third electrode film to a nonconducting state and to set a portion of the plurality f third semiconductor members surrounded with the fourth conductive portion or the third conductive portion of the third electrode film to a nonconducting state.

11. The device according to claim 6,
further comprising a drive circuit configured to independently apply potentials respectively to the first electrode film, the first conductive portion or the second conductive portion of the second electrode film, and the sixth electrode film pierced by the plurality of first semiconductor members.

12. The device according to claim 11, wherein
the drive circuit is configured to independently apply potentials respectively to the first electrode film, the first conductive portion or the second conductive portion of the second electrode film, and the sixth electrode film pierced by the plurality of second semiconductor members.

13. The device according to claim 12, wherein the drive circuit applies a common potential to a portion of the fourth electrode film surrounding the plurality of first semiconductor members, a portion of the fourth electrode film surrounding the plurality of second semiconductor members, and a portion of the fourth electrode film surrounding the plurality of third semiconductor members.

14. The device according to claim 1, wherein the first insulating portion of the second electrode film includes:
two first portions extending in the third direction and being made from a first material; and
a second portion disposed between the two first portions, the second portion being made from a second material having a relative dielectric constant higher than a relative dielectric constant of the first material.

15. A semiconductor memory device, comprising:
two first select gate electrode films arranged above a substrate to be separated from each other in a first direction crossing a substrate surface;
n second select gate electrode films arranged between the two first select gate electrode films (n being an integer of 2 or more), each of the n second select gate electrode films including a conductive portion and an insulating portion, the insulating portion being disposed at mutually-different position in a second direction among the second select gate electrode films, the second direction crossing the first direction;
a word line electrode film arranged between the substrate and the two first select gate electrode films;
n semiconductor members each piercing the insulating portion of one of the second select gate electrode films, the conductive portion of the other second select gate electrode film, the two first select gate electrode films, and the word line electrode film, the n semiconductor members each piercing the mutually-different insulating portion of the second select gate electrode films; and
charge storage members provided respectively between the word line electrode film and the semiconductor members.

16. The device according to claim 15, further comprising a drive circuit applying a potential to set a portion of one of the semiconductor members surrounded with one of the second select gate electrode films to a conducting state when selecting the one of the semiconductor members, the one of the second select gate electrode films including the insulating portion pierced by the one of the semiconductor members, the one of the second select gate electrode films being interposed between other second select gate electrode films or between another second select gate electrode film and one of the two first select gate electrode films, the potential being applied to portions of the other second select gate electrode films surrounding the one of the semiconductor members or to portions of the other second select gate electrode film and the one of the two first select gate electrode films surrounding the one of the semiconductor members.

17. A method for driving a semiconductor memory device,
the device including a first electrode film, a second electrode film, a third electrode film, a fourth electrode film, a fifth electrode film, a plurality of first semiconductor members, and a first charge storage member, the second electrode film being separated from the first electrode film in a first direction and including a first conductive portion, a first insulating portion, and a second conductive portion arranged in this order along a second direction crossing the first direction, the first insulating portion extending in a third direction and insulating the first conductive portion and the second conductive portion, the third direction crossing the first direction and the second direction, the third electrode film being separated from the second electrode film in the first direction, the third electrode film including a third conductive portion, a second insulating portion, and a fourth conductive portion arranged along the second direction, the second insulating portion extending in the third direction and insulating the third conductive portion and the fourth conductive portion, the fourth electrode film being separated from the third electrode film in the first direction, the fifth electrode film being separated from the fourth electrode film in the first direction, the plurality of first semiconductor members each extending in the first direction and each piercing the first electrode film, the first insulating portion of the second electrode film, the third conductive portion or the fourth conductive portion of the third electrode film, the fourth electrode film, and the fifth electrode film, the first charge storage member being provided between the fifth electrode film and one of the plurality of first semiconductor members, the method comprising applying a first potential to set a portion of the plurality of first semiconductor members surrounded with the first insulating portion to a conducting state when selecting the first semiconductor member, the first potential being applied to portions of the first electrode film and the third electrode film surrounding the plurality of first semiconductor members.

18. The method according to claim 17, wherein the device further includes a sixth electrode film provided between the third electrode film and the fourth electrode film and separated from the third electrode film and the fourth electrode film, the sixth electrode film including a fifth conductive portion, a third insulating portion, and a sixth conductive portion arranged along the second direction, the plurality of first semiconductor members each further pierces the sixth electrode film, and the method further comprises applying a second potential to set a portion of the first semiconductor member surrounded with the sixth electrode film to a conducting state when selecting the first semiconductor member, the second potential being lower than the first potential and being applied to a portion of the sixth electrode film surrounding the plurality of first semiconductor members.

19. The method according to claim 17, wherein a ground potential is applied to the first conductive portion and the second conductive portion of the second electrode film when selecting the plurality of first semiconductor members.

* * * * *